United States Patent
Arisumi

(10) Patent No.: US 7,527,982 B1
(45) Date of Patent: May 5, 2009

(54) MANUFACTURING METHOD OF A SEMICONDUCTOR DEVICE INCLUDING A CRYSTALLINE INSULATION FILM MADE OF PEROVSKITE TYPE OXIDE

(75) Inventor: Osamu Arisumi, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 417 days.

(21) Appl. No.: 09/617,138

(22) Filed: Jul. 14, 2000

(51) Int. Cl.
*H01L 21/00* (2006.01)
(52) U.S. Cl. .................. 438/3; 257/761; 257/E21.01
(58) Field of Classification Search ............ 257/E21.01, 257/E21.009, 761; 438/3
See application file for complete search history.

(56) References Cited

U.S. PATENT DOCUMENTS

| | | | | |
|---|---|---|---|---|
| 5,043,049 A | * | 8/1991 | Takenaka ............... | 204/192.15 |
| 5,391,393 A | * | 2/1995 | Maniar ............................ | 438/3 |
| 5,817,532 A | * | 10/1998 | Joo et al. ......................... | 438/3 |
| 6,194,229 B1 | * | 2/2001 | Basceri ............................ | 438/3 |
| 6,323,057 B1 | * | 11/2001 | Sone ........................... | 438/104 |
| 6,543,107 B1 | * | 4/2003 | Miyashita et al. ........... | 29/25.35 |
| 6,608,383 B2 | * | 8/2003 | Yokoyama et al. ........... | 257/761 |

FOREIGN PATENT DOCUMENTS

JP 11-204746 7/1999

\* cited by examiner

*Primary Examiner*—Howard Weiss
*Assistant Examiner*—John C Ingham
(74) *Attorney, Agent, or Firm*—Finnegan, Henderson, Farabow, Garrett & Dunner, L.L.P.

(57) ABSTRACT

In order to improve the characteristic of the PZT film (insulation film of capacitor) of the PZT capacitor, after forming the amorphous PZT film, the amorphous PZT film is crystallized from at least the upper surface of the amorphous PZT film to form the PZT crystal film by employing the process whose sequence is reverse to that of the conventional process. In this case, the amorphous PZT film, which contains excessive oxygen and formed on the upper surface of the amorphous PZT film, is used as a seed.

14 Claims, 23 Drawing Sheets

TUBULAR BULB:Cu
(WAVELENGTH:1.54056A)
TUBULAR BULB VOLTAGE:44KV
TUBULAR BULB CURRENT:250mA
GONIOMETER:WIDE-ANGLE
GONIOMETER
STEP WIDTH:0.040°
TIME FOR MEASUREMENT:0.50sec
SCANNING AXIS:2$\theta$/$\theta$ DIVERGENCE SLIT:1/2°
DIFFRACTION SLIT:1/2°
LIGHT RECEIVING SLIT:0.15mm
LIGHT RECEIVING SLIT OF
MONOCHROMATER:
LIGHT RECEIVING SLIT:0.45mm
$\theta$ OFFSET ANGLE:0.000°

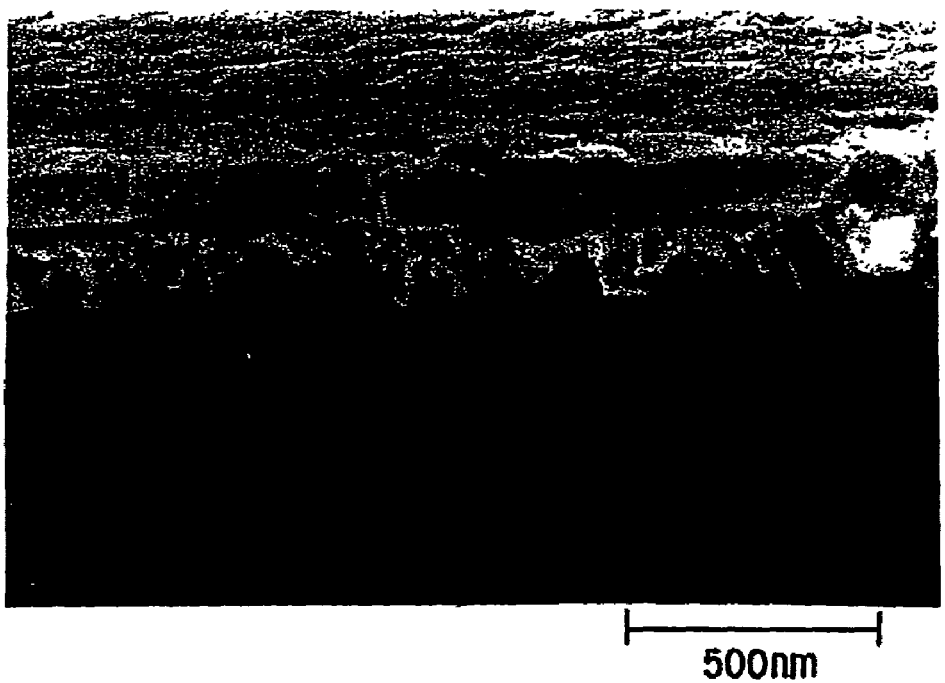
F I G. 3A
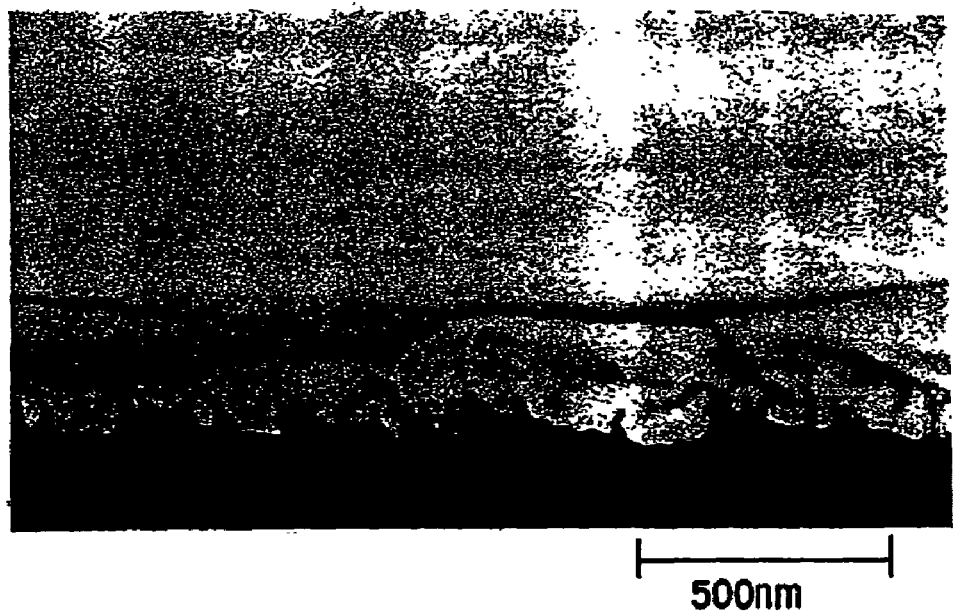
F I G. 3B

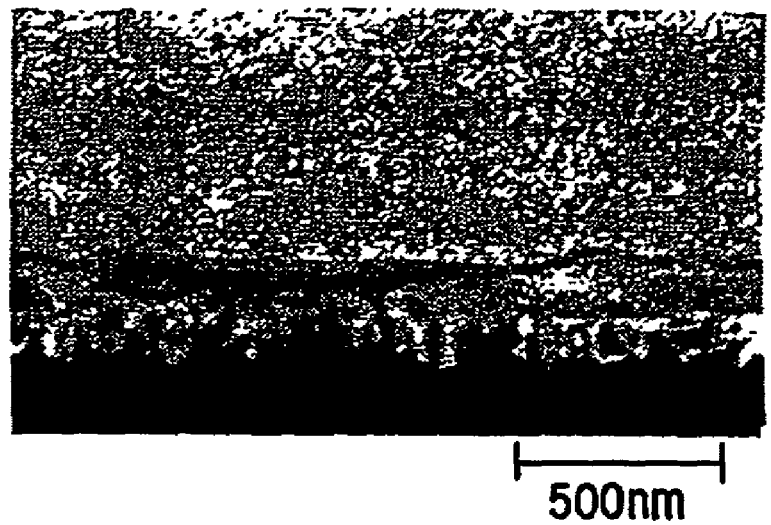
F I G. 18A
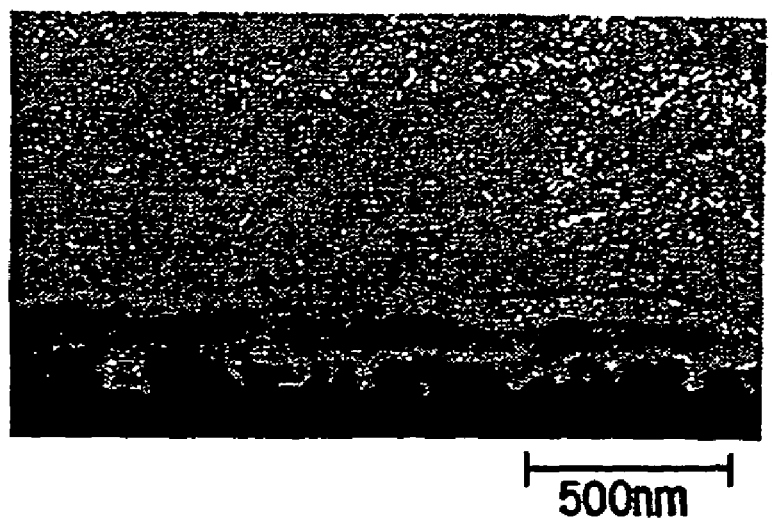
F I G. 18B

TUBULAR BULB: Cu
TUBULAR BULB VOLTAGE: 44KV
TUBULAR BULB CURRENT: 250mA
GONIOMETER: WIDE-ANGLE GONIOMETER
STEP WIDTH: 0.040°
TIME FOR MEASUREMENT: 0.50sec
SCANNING AXIS: $2\theta/\theta$ DIVERGENCE SLIT: 1/2°
DIFFRACTION SLIT: 1/2°
LIGHT RECEIVING SLIT: 0.15mm
REVOLUTION SPEED: 60rpm/min
LIGHT RECEIVING SLIT OF MONOCHROMATER:
LIGHT RECEIVING SLIT: 0.45mm
$\theta$ OFFSET ANGLE: 0.000°

Y-AXIS:P(POLARIZATION)
X-AXIS:V(APPLIED VOLTAGE)
Pr+:POINT OF INTERSECTION OF HYSTERESIS CURVE WITH POSITIVE SIDE OF Y-AXIS
Pr-:POING OF INTERESECTION OF HYSTERSIS CURVE WITH NEGATIVE SIDE OF Y-AXIS

2Pr=Pr+−Pr−

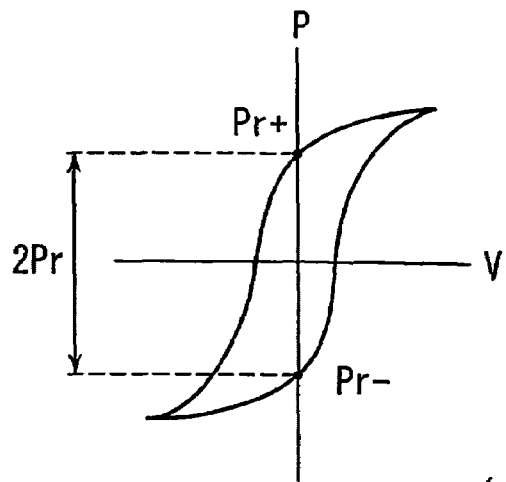

FIG. 25

Psat.+:POSITIVE SATURATION POLARIZATION AMOUNT

Psat.−:NEGATIVE SATURATION POLARIZATION AMOUNT

RECTANGULARITY RATIO = $\dfrac{Pr+}{Psat.+}$ & $\dfrac{Pr-}{Psat.-}$

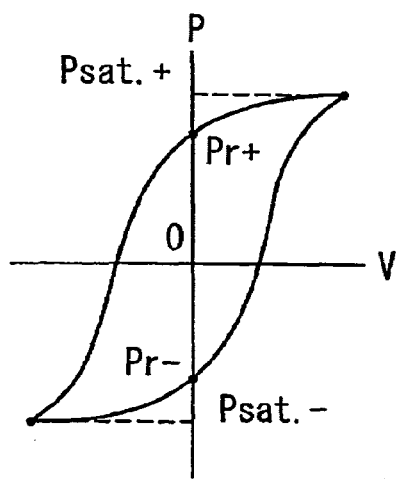

FIG. 26

MANUFACTURING METHOD OF A SEMICONDUCTOR DEVICE INCLUDING A CRYSTALLINE INSULATION FILM MADE OF PEROVSKITE TYPE OXIDE

CROSS-REFERENCE TO RELATED APPLICATIONS

This application is based upon and claims the benefit of priority from the prior Japanese Patent Application No. 11-200901, filed Jul. 14, 1999, the entire contents of which are incorporated herein by reference.

BACKGROUND OF THE INVENTION

The DRAM (Dynamical Random Access Memory), since its appearance as a charge-storage memory, has been used widely as a semiconductor memory whose degree of integration has been increasing generation after generation. However degree of integration progresses for further reduction of element size, it is necessary the electric capacity of the capacitor to be maintained at about 30 fF. As a method for meeting this requirement, the study has been made on method for replacing the dielectrics film with a thin film in order to increase the effective area of the capacitor corresponding to the reduction in the size of the element.

On the other hand, it is considered that the lithographic method is cannot be only method capable of meeting the technical requirement for the giga-bit generation of semiconductors. For instance, there is an increasing demand for forming the wiring of the capacitor by using a new material in order to assure necessary performance of highly fined (wiring). The research for development and practical use of this kind and material are already under way.

It is considered effective for the giga-bit generation, for the reason described later, to use a material having a higher dielectric constant than those of $SiO_2$ and $Si_3N_4$ such as so-called high dielectric material.

In order to prevent the reduction of the effective area of the capacitor resulting from the progress of the semiconductor for higher integration, the 3D-capacitor such as the trench cell and stack cell has been adopted. After the 1-giga-bit generation, the 3D-capacitor as is described above is becoming increasingly complex and fine, thereby suggesting the limitation of the manufacture of (further advanced) DRAM's. Further thinning of the capacitor insulation film invites the increase in leakage current caused by the tunnel current.

As high dielectric materials, the composite oxides such as $SrTiO_3$, $Ba_xSr_{1-x}$ (BST) and the like are coming to the fore. Since these materials have the perovskite structure respectively, they give high dielectric constants respectively.

However, for example, in the case of the BST film formation by the CVD method, the problem such as the increase in the leakage current caused by the absence of Ti atom or the defective crystallization in the film resulting thinning of the film is becoming increasingly conspicuous.

On the other hand, the non-volatile high dielectric memory cell and the Ferroelectric RAM having its array, using the high dielectric film made of lead titanate perovskite compound or bismuth (layered) compound as the interelectrode insulation film of the capacitor for the storage of information, are coming to attract the attentions of those who concerned.

Being a non-volatile type, the Ferroelectric RAM has an advantage that not only it does not require refreshing operation for the holding of the data but also it does not require power consumption during stand-by period.

Further, the Ferroelectric RAM compared with the flash memory, which is also a kind of the non-volatile memory, has an advantage that data re-writing can be made a greater number of times and at a much higher speed.

In addition, the EEPROMs (Electrically Erasable Programmable Read Only Memories) which include flash or other memories have the following problems. The common problem of these memories is that they requires at least 3 power source voltages, thereby requiring a large power consumption. The storage of the information is done by injection of electron to and draw of electron from a floating gate through an insulation film called tunnel oxide. The injection and draw of electron causes the breakdown (fatigue) of the tunnel insulation film and the deterioration of the electric characteristic of the tunnel insulation film.

Further, compared with the power consumption of the SRAM (Static RAM), which can be backed up with a battery used for memory card and the like, the power consumption (of the Ferroelectric RAM) is smaller and has the potentiality for higher integration and further reduction in the area of the cell.

Having such a new function, the Ferroelectric RAM, as a next-generation memory, is considered to have an ability to replace the existing flash memory, SRAM and DRAM because of its potentiality for application to the logic device with embedded components and the like. Further, the Ferroelectric RAM is beginning to be used for the non-contact cards (FR-D: Radio Frequency-Identification), because of its advantage that it can operate at a high speed without battery.

However, the formation technique of the Ferroelectric RAM, as a highly integrated device, especially the technique for incorporating the ferroelectric film into the card, has not be established yet. For instance, if a ferroelectric film is formed by the sputtering method by using $PbZr_xTi_{1-x}O_3$ (PZT), which is made of the $ABO_3$ perovskite type structure, where the A means A-site atom, B means B-site atom, PZT film is apt to form the columnar crystal, especially on the ground electrode such as Pt electrode. Further, if the PZT film is affected by the roughness of the ground electrode, the surface morphology of the PZT film presents an extremely rough condition.

Further, when a pluralistic material such as $SrRuO_3$(SRO), one of the conductive oxides, or the like is used as a constituent material of the ground electrode, this causes a problem that the constituent element of the SRO film diffuses in the PZT film with respect to the crystallization of the amorphous PZT film in the upper layer of the ground electrode (SRO film). This causes not only the deterioration of ferroelectric characteristic but also the increase in the amount of leakage current.

Further, in the case of the conventional method, in which the amorphous PZT film is crystallized starting from an interface of the lower (bottom) electrode, there occurs a problem that the Pb atoms diffuse in the lower electrode simultaneously with the crystallization, causing the defect of the Pb. Such problem can be alleviated by the method such as providing a buffer layer containing the (B-site) atoms such as Ti and supplying surplus amount of Pb in the vicinity of the lower electrode interface, but the omission of the Pb in the outermost surface lay cannot be prevented. Such Pb omission leads to the deterioration of the ferroelectric characteristic or the deterioration of the reliability such as the polarization fatigue characteristic.

Further, in consideration of the volatile matter of the Pb producing a high vapor pressure, the Pb content in the amorphous PZT film is increased by about several tens % (e.g., about 20%). Therefore, in the case where the conventional method, in which the amorphous PZT film is crystallized from the lower (bottom) interface, is employed, the surplus (excess) Pb, as is described above, segregates in the direction which the crystallization progresses. Consequently, the Pb tends to exists excessively on the surface region or in grain boundary of the PZT film, which has undergone crystallization process, and a layer having a low dielectric constant such as PbO tend to be formed on the above-described surface or in grain boundary. Such low-dielectric-constant layer forms the pass for the leakage current, causing large deterioration of high ferroelectric characteristic.

Further, in the interface between the lower or upper capacitor electrode and upper capacitor electrode, asymmetry of the PZT film occurs in the direction of the film thickness. Or, the defect of the crystallization can tend to concentrate in the vicinity of the interface of one side because of that the crystallization starts only from one direction, that is, from the interface of the lower electrode. Such factor leads to the deterioration of the polarization fatigue or degradation of switching endurance characteristic. Further, when such capacitor is applied to the memory, this causes the occurrence of the problem such as the decline of the reliability concerning the operation of the memory, such as the occurrence of imprint phenomenon and poor retention characteristic.

BRIEF SUMMARY OF THE INVENTION

The object of the present invention is to provide a semiconductor device, includes a crystalline insulation film made of the $ABO_3$ perovskite type oxide dielectric having a fine characteristic, and its manufacturing method. For the above object, the semiconductor device according to the first aspect of the present invention comprises: a ground film; and a crystalline insulation film formed on the ground film, made of $ABO_3$ perovskite type oxide dielectric material and having an interface that lies halfway between upper and lower surface of the film.

Further, the semiconductor device according to the second aspect of the present invention includes the ground film, the crystalline insulation film comprising the $ABO_3$ perovskite oxide dielectric formed on the ground film, wherein the B is Zr and Ti, and the mole ratio of the Zr to the sum of the Ti and Zr is 0.3 or less at least on the surface of the crystalline insulation film ($x \leq 0.3$ in $PbZr_xTi_{1-x}O_3$). In this case, the mole ratio on the lower surface of the crystalline insulation film (the interface between the crystalline insulation film and the ground film) is also desirable to be 0.3 or less besides that on the upper surface of the crystalline insulation film.

In the semiconductor device manufacturing method according to the third aspect of the present invention comprises a process, an amorphous film to constitute the crystalline insulation film is formed when forming the crystalline insulation film comprising the $ABO_3$ perovskite type oxide dielectric on the ground film, and the amorphous film is crystallized at least from the upper surface side of the amorphous film to complete the crystalline insulation film. The preferable processes of the $ABO_3$ perovskite type oxide dielectric are as follows:

(1) In the $ABO_3$ perovskite type oxide dielectric, A (A-site) is a substance containing one or more elements selected from among Pb, Ba and Sr, while B (B-site) is a substance containing (one) or more elements selected from among Zr, Ti, Ta, Nb, Mg, W, Fe and Co.

(2) Prior to the formation of the amorphous film, the oxygen is introduced into at least the upper surface of the amorphous film, or an amorphous film with a higher oxygen concentration and a smaller thickness than those of the amorphous film is formed at least on the upper surface of the amorphous film.

(3) Prior to the crystallization of the amorphous film, a material whose temperature at which the crystallization starts is lower than that of the constituent material of the amorphous film is introduced at least onto the upper surface of the amorphous film.

(4) The composition ratio of A-site atom to the amorphous film on the upper surface side is lower than that on the side of the interface between the amorphous film and the substrate (ground film), or the composition ratio on the upper surface side and the interface is lower than that of the central portion of the amorphous film.

(5) The composition of the amorphous film on the basis of the atom of B-site is selected so that the temperature, at which the crystallization of the amorphous film starts, decreased towards the upper surface side and the interface side, starting from the central portion of the amorphous film.

(6) Prior to the crystallization of the amorphous film, a crystallization accelerating film, having a higher crystal orientation than that of the ground film, is formed on the amorphous film.

(7) In the process (6), the crystallization accelerating film is of either single-layer film or (laminated) film selected from among MgO film, $Al_2O_3$ film, Sapphire film, $Y_3FeO_{12}$ film, $(YGd)_3Fe_5O_{12}Ag$ film and Pt film.

(8) In the process (6), the constituent material of the crystallization accelerating film is an insulation material, and the crystallization accelerating film crystallizes the amorphous film, forms an opening in the crystallization accelerating film and forms an electrode to be connected to the crystalline insulation film trough the opening.

(9) A crystallization inhibiting film, whose temperature at which the crystallization starts is higher than that of the amorphous film, is formed on the ground film, and the amorphous film is formed on the crystallization inhibiting film, whereby the crystallization of the amorphous film is inhibited from the side of the interface with the ground film during the process in which the crystalline insulation film is formed.

(10) In the process (6), after the amorphous film is crystallized, the crystallization accelerating film is removed.

(11) In the process for forming the crystalline insulation film, the crystallization of the amorphous film is inhibited from the side of the interface with the ground film.

(12) In the process (9), the crystallization inhibiting film has a preferred orientation weaker than that of the ground film.

(13) In the process (9), the crystallization inhibiting film is of single-layer or laminate selected from among Au film, oxidized Au film, Ir film, oxidized Ir film, Ru film, oxidized Ru film, Rh film and oxidized Rh film.

Further, at least two of the processes (1), (2), (3), (4) and (9) are used in combination. An alter-native manufacturing method, including a process for forming a crystalline insulation film comprising the $ABO_3$ perovskite type oxide dielectric, may be employed.

Conventionally, in forming the crystalline insulation film comprising the $ABO_3$ perovskite type oxide dielectric, an amorphous film to become a crystalline insulation film is formed on the ground to start the crystallization from the interface with the ground film. More particularly, the crystallization is started from the ground film to form the crystalline insulation film. However, this kind of method and how to improve this method have the problems as are described in connection with the conventional method.

Thus, the present inventor has attempted the crystallization from the upper surface of the amorphous film and also from both the upper surface and lower surface of the amorphous film. As a result, it is clarified that the amorphous film not only can be crystallized but also the crystal having a better characteristic can be obtained (by these method). When the crystallization was made to proceed from both the upper surface and lower surface of the amorphous film, an interface was observed, lying halfway between the upper and lower surfaces of the amorphous film.

Therefore, according to the present invention based on such new information, it will become possible to realize the crystalline dielectric insulation film comprising the $ABO_3$ perovskite type oxide dielectric having a better characteristic than those of conventional ones. Further, from the result of the XRD (X-ray Diffraction) pattern of such crystalline ferroelectric film it was found that the (222) peak exists with its and also that another peak (second phase) is present near the (222) peak. A diffraction angle 2θ at the second peak is about 81.5° to 82°, and more specifically about 81.8°.

Further, according to the result of the study conducted by the present inventor, it was clarified that the crystalline insulation film comprising the $ABO_3$ perovskite type oxide dielectric, with B being Zr and the ratio of Zr to the sum of the Zr and Ti being 0.3 or less, has a characteristic, specifically the polarization fatigue characteristic, better than that of conventional one.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are the photos (sectional SEM photos) of the conventional PZT film;

FIGS. 18A and 18B are photos of the PZT film according to conventional art and that according to the present invention (sectional TEM photos);

FIG. 25 shows the definition of the 2Pr; and

FIG. 26 shows the definition of rectangularity ratio.

DETAILED DESCRIPTION OF THE INVENTION

Figure 1A:
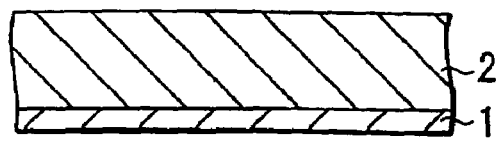
FIGS. 1A-1E show cross-sectional views of the processes for forming the PZT capacitor according to the first embodiment of the present invention.

The embodiments of the present invention will be described in the following referring to the drawings.

The First Embodiment

FIGS. 1A-1E are sectional views showing the forming process of the PZT capacitor relating to the first embodiment of the present invention.

First, as shown in FIG. 1A, Ti film, 20 nm thick, and Pt film 2, 175 nm thick, to constitute a lower electrode are formed sequentially on a ground insulation film (not shown) under a reduced pressure of Ar gas atmosphere by the DC sputtering method.

Electric power required during the Ti film 1 forming process is 1 kW for 3 seconds. On the other hand, the electric power required for the Pt film 2 formation is 3 kW for 38 seconds. The ground insulation film is a laminated film comprises, for example, a plasma nitride film of 150 nm thick and a plasma TEOS (tetraethylorthosilcate) film of 25 nm thick formed thereon. A Ti oxide film may be used instead of the Ti film.

Figure 1B:
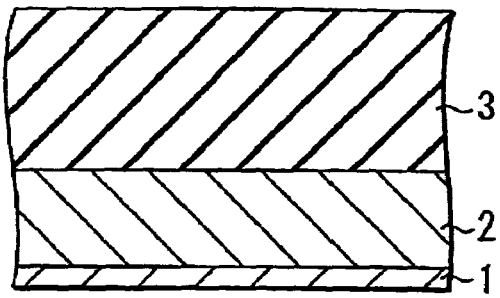

Next, as shown in FIG. 1B, an amorphous PZT film 3, 90 nm thick, is formed on the Pt film 2 by RF magnetron sputtering method in Ar gas atmosphere whose pressure is reduced to 3.5 Pa. The electric power required for forming the film is 1 kW for 362 seconds.

Figure 1C:
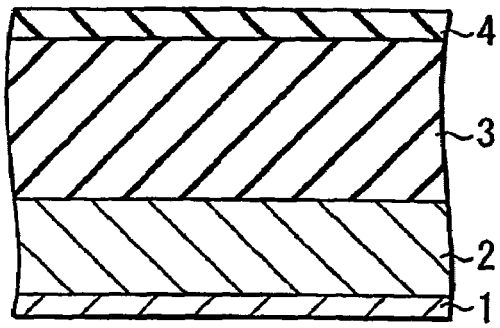

Next, as shown in FIG. 1C, an amorphous PZT film 4, 18 nm thick and containing surplus oxygen in its surface, is formed on the surface of the amorphous PZT film 3 by the RF magnetron sputtering method in the atmosphere of the mixed gas of Ar and $O_2$. This amorphous PZT film 4 containing added surplus oxygen acts as a seed crystal in the crystallization process. Further, the oxygen may be added excessively to the surface of the amorphous PZT film 3 to use the area as the seed. In the present invention, the surface of the amorphous PZT film 3 means not only the area proximate to the uppermost surface area but also the area having the film thickness of $1/10$-$1/20$.

The electric power required for the formation of the film by the sputtering process is 1 kW and 250 seconds. Further, the PZT target is formed by baking (the material) having composition of (Pb: 1.07) (La: 0.03) (Zr: 0.3, Ti: 0.7)$O_3$.

Figure 1D:
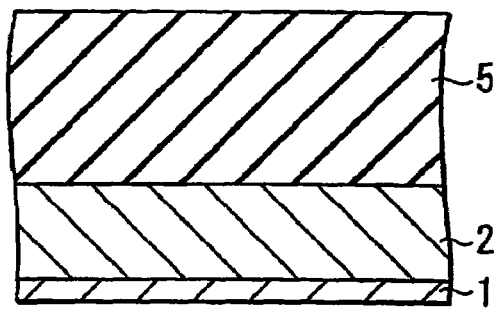

Next, as shown in FIG. 1D, the PZT crystalline film 5 is formed by crystallizing the amorphous PZT films 3 and 4 by the RTA (Rapid Thermal Annealing) at 700° C. in the oxygen atmosphere.

In this case, the crystallization of the amorphous PZT films 3 and 4 progresses from the surface side of the amorphous PZT film 4. Further, the thickness of the PZT film 5 becomes 100 nm as the result of film contraction due to the separation of the Pb or the like FIGS. 2A, 2B, 3A, 3B and 4 show the results of measurements to endorse what is discussed above.

Figure 2A:
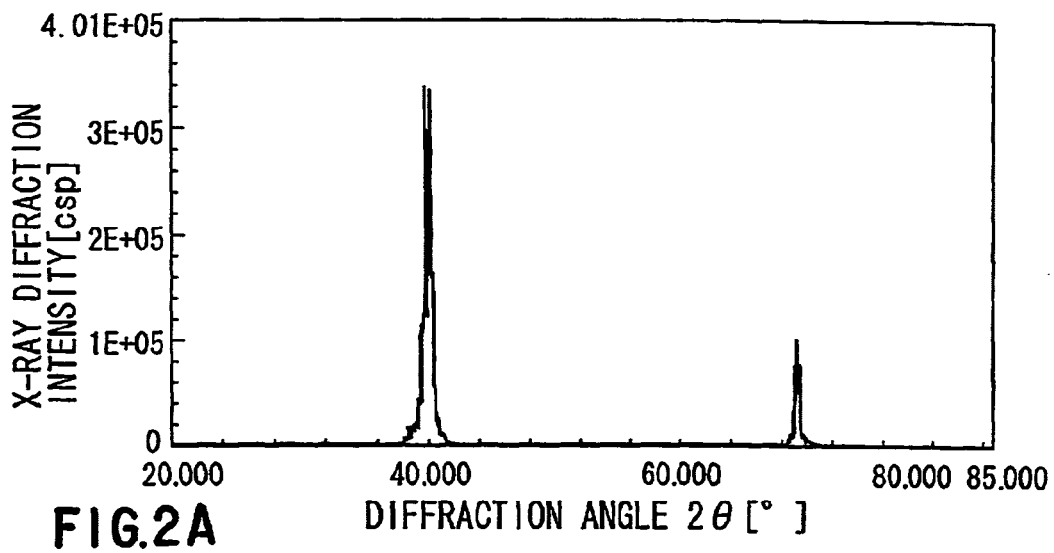
FIGS. 2A-2C show the result of study by XRD measurement of the preferred orientation (tendency) of the PZT film.
Figure 2B:
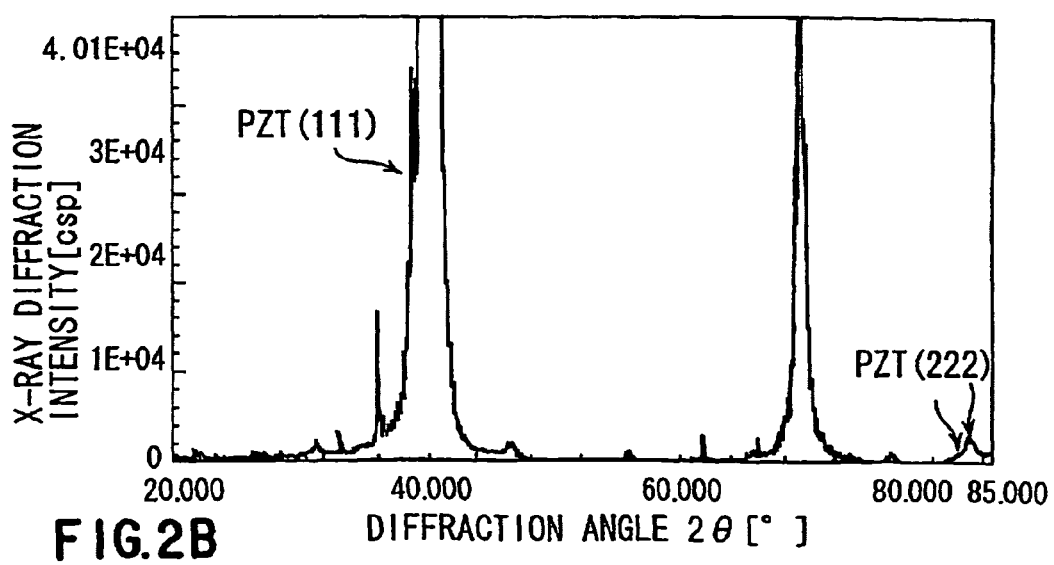
Figure 2C:
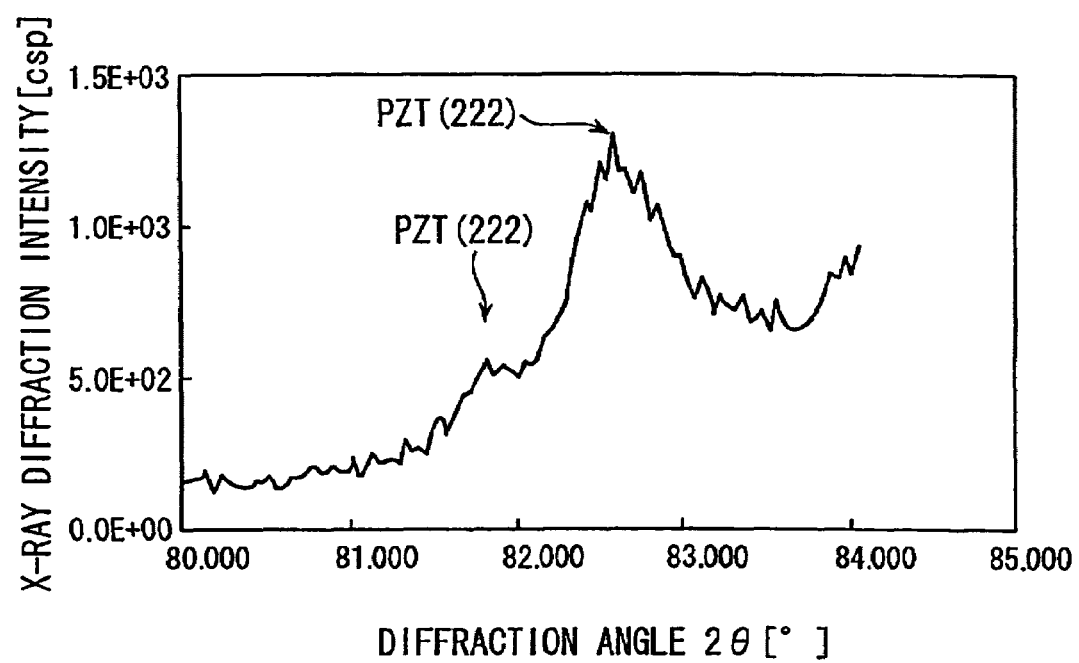
Figure 24A:
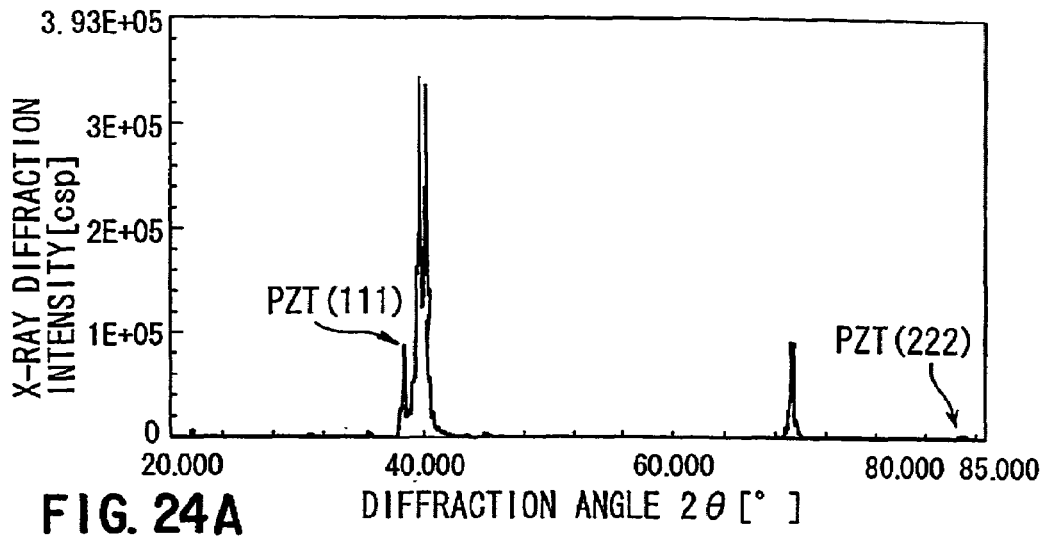
FIGS. 24A-24C shows the result of XRD pattern for the preferred orientation of crystallized film of conventional PZT.
Figure 24B:
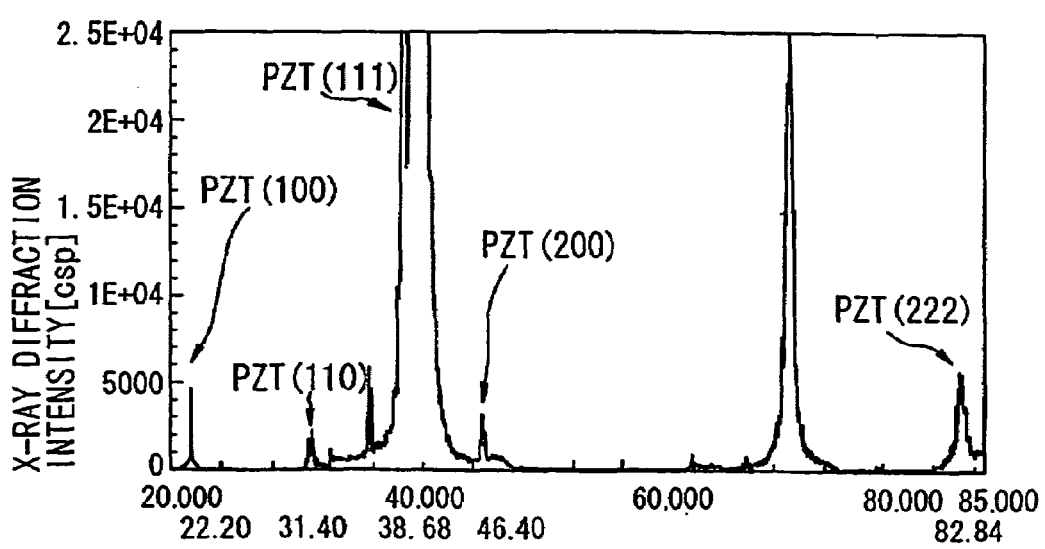

FIGS. 2A-2C show the results of examination by X-ray diffraction measurement (XRD) of preferred orientation of the PZT crystalline film 5 according to the present invention. In the figure, x-axis represents the x-ray diffraction intensity [cps], while y-axis represents the diffraction angle 2θ [°] respectively. Further, FIG. 2B is a partial enlarged view of FIG. 2A. Further, FIGS. 24A and 24B shows the result of the examination by the XRD measurement of the preferred orientation of the PZT crystal film.

From the patterns of the measured data by XRD, it is found that, in the case of the PZT crystalline film 5 where the seed larger is provided on the surface side, the preferred orientation is predominant in the direction of (111) and in the direction of (222) where 2θ=36.68° and 82.84°, while, in the case of the conventional PZT crystal film where the seed larger is provided in the interface of the lower electrode, sharp peaks appear in the direction of (100) and in the direction of (200) too where 2θ=22.20 and 46.40.

Further, in the case of the conventional PZT film 5, according to the present invention, the peak (111) or (222) is divided into two peaks, suggesting the presence of two kinds of perovskite differing in lattice constant, while, in the case of the conventional PZT film the peak (111) is substantially of one kind.

Figure 24C:
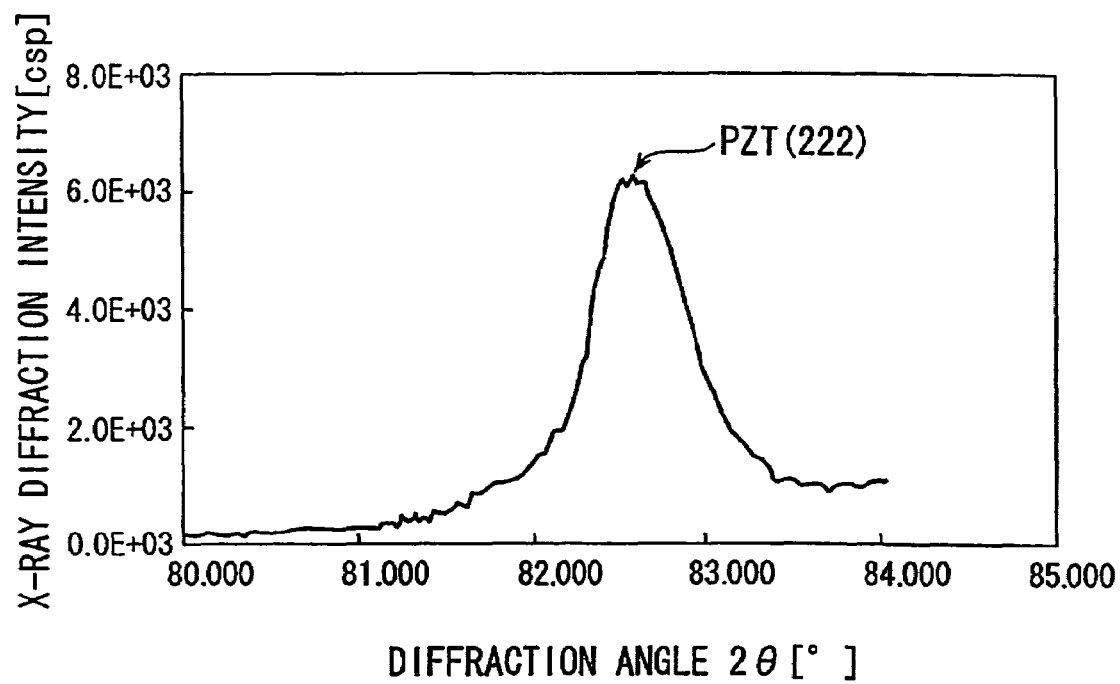

As regards the (222) peak (first peak), it was found that there is another peak (second peak) near the (222) peak (FIG. 24C), which was not found in the prior art. From this point, too, it is understood that there is a difference in structure between the PZT crystalline film 5 of the present invention and the prior-art PZT crystalline film. The reason for this appears to be that the (222) peak was divided into two when the PZT film was formed by the method. It was confirmed that a diffraction angle 2θ at the second peak is about 81.5° to 82°, and more specifically about 81.8°.

Further, FIGS. 3A and 3B show the SEM photos respectively showing the sectional views of the PZT crystal film according to the present invention and the conventional PZT crystal film, more particularly, the SEM photos showing the diagonal sections of these PZT crystal films. From the figures, it can be noticed that an extremely smooth surface morphology can be obtained by starting the crystallization from the surface side of the amorphous PZT film.

Figure 4:
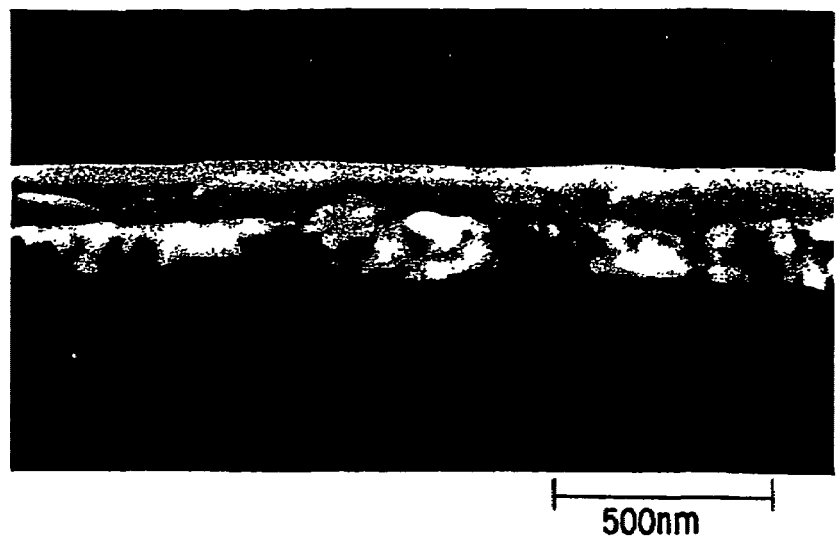
FIG. 4 is an SEM photo of the PZT film according to the present invention.
Figure 6A:
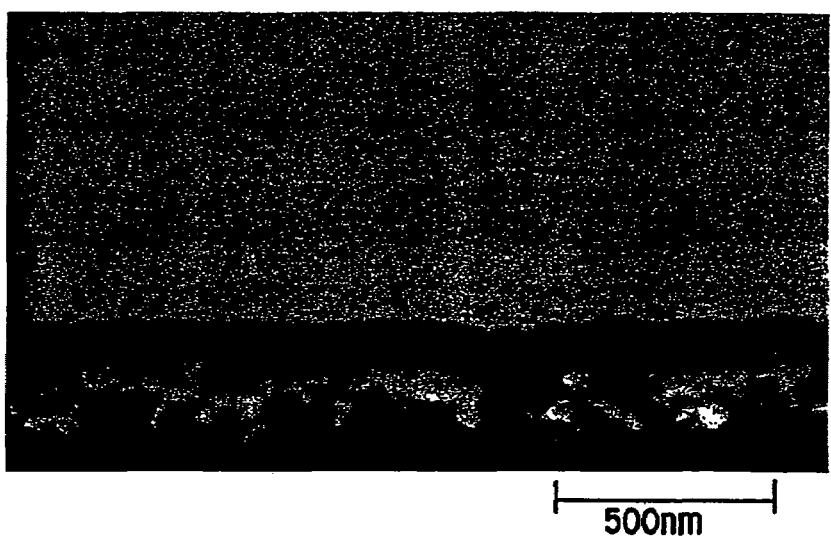
FIGS. 6A and 6B are the SEM photos showing the conventional capacitor before undergoing the forming gas annealing processing and after undergoing the same processing (sectional SEM photographs)
Figure 6B:
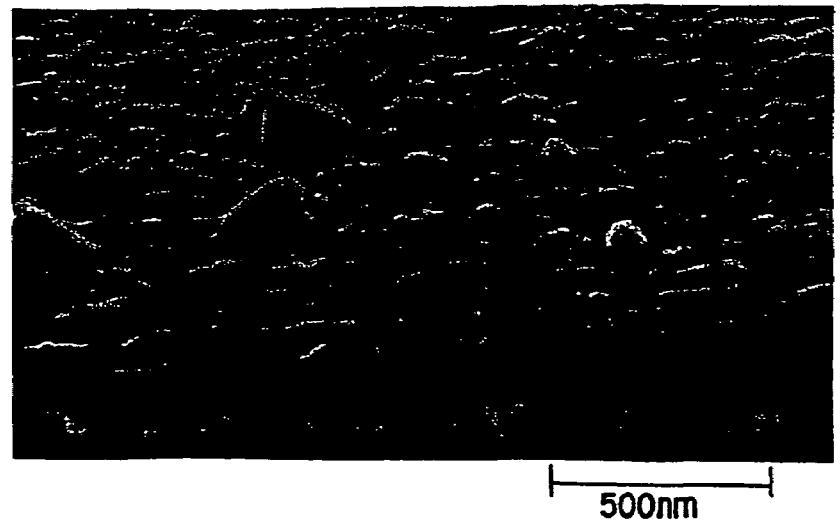

FIG. 4 is a SEM photo showing the cross section of the PZT crystal film according to the present invention, more particularly, showing the vertical cross section of the PZT film. From the figure, it can be noticed that, in the case of the PZT crystal film 5, the crystallization starts form the surface side unlike the case of the conventional PZT film.

The reason why such a fine surface morphology can be obtained has not been clarified yet, but the present inventor considers this results from the reason given below.

In the case of the conventional method, the crystallization of the amorphous PZT film 3 progresses from its back side (the interface between Pt film 2 and the amorphous PZT film 3) to the surface of the amorphous PZT film 3.

In the conventional crystallization process as is described above, the growth of crystallization. In a conventional crystallization step, a grain anisotropically grows, with a seed layer at a lower interface being used as a seed. Accordingly, if an amorphous PZT film is crystallized and the growth of the grain terminates, greater unevenness appears on a PZT surface at a part of the end face of the grain, as the grain growth has progressed conspicuously. Consequently, roughness of the PZT surface increases.

On the other hand, in the case of the present invention, the crystallization of the amorphous PZT film 3 progresses from its surface to the Pt film 2. At this time, since the amorphous PZT film is laterally crystallized, the surface of the amorphous PZT film is immediately crystallized and sintered. Thus, the rate of grain growth near the surface tends to be saturated at the initial stage of crystallization. As a result, it is considered that surface unevenness hardly appears and the surface becomes flat, and therefore good surface morphology is obtained.

Thus, in the case of the present invention, a crystallized PZT 5 having a small surface roughness can be obtained.

One of the factors (of the above effect) is that the roughness of the surface occurring in the case of the composition in which the share of Zr is larger than that of Ti can be suppressed by preventing the share of Zr from becoming excessive in the surface.

Figure 1E:
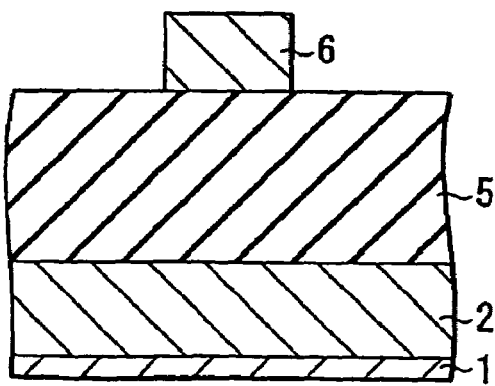

Next, as shown in FIG. 1E, a columnar Pt electrode 6, as an upper electrode of 175 nm thick and 160 nm in diameter, is formed on the PZT crystal film 5. The before-patterning Pt film to become the Pt electrode 6 is formed by the sputtering method, and the film forming conditions should be the same as those for the Pt film 2.

Finally, the PZT capacitor is completed by applying the heat treatment to the PZT crystal film 5 at 650° C. for 1 hour in the oxygen atmosphere by using an electric furnace.

Figure 5:
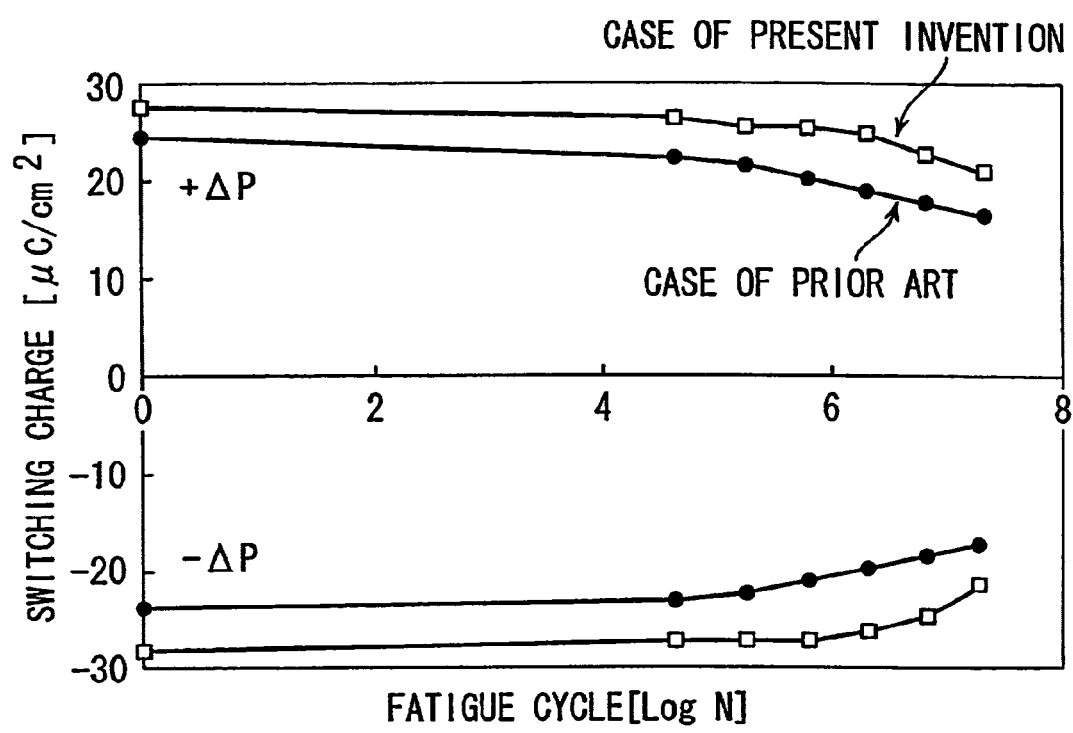
FIG. 5 is a diagram illustrating the polarization fatigue characteristic of the PZT capacitor according to the present invention and that of the conventional PZT capacitor.
Figure 7A:
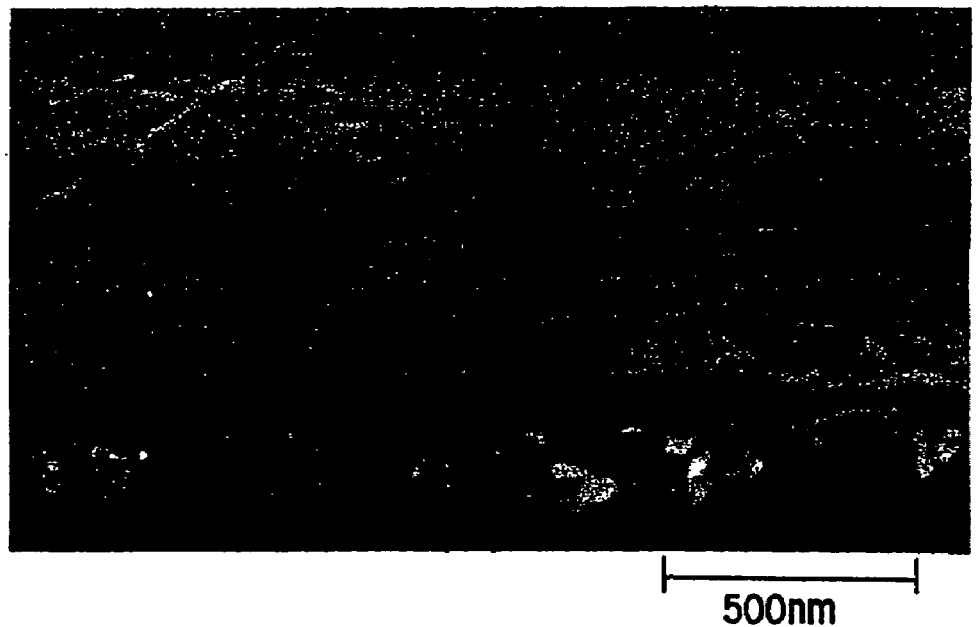
FIGS. 7A and 7B are photographs taken by a scanning electron microscope (sectional photos by SEM) of the PZT capacitor according to present invention before undergoing the forming gas annealing processing and after undergoing the same processing.
Figure 7B:
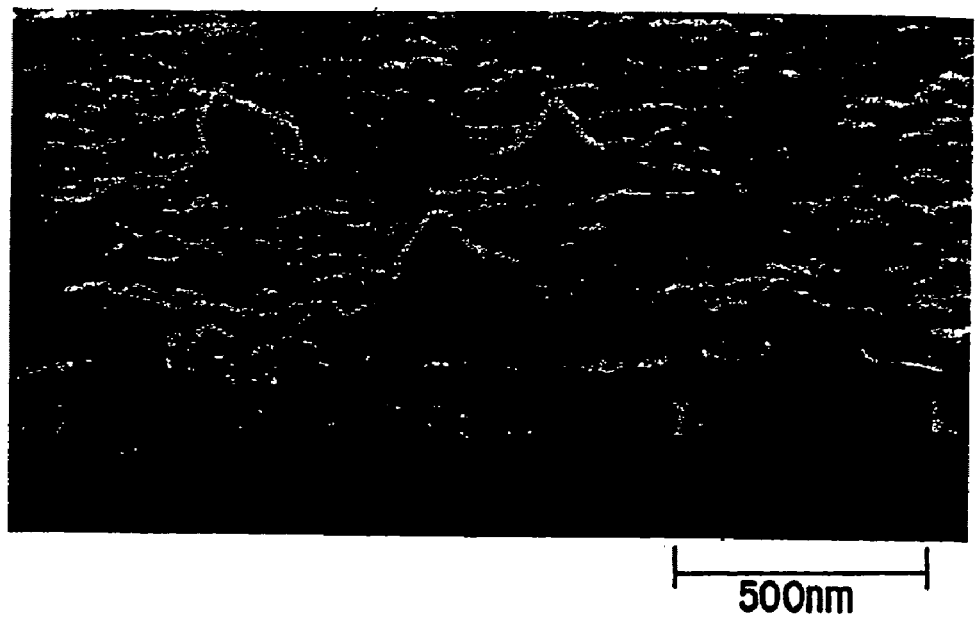

The PZT capacitor obtained by the process according to the present invention as described above and the capacitor obtained according to the conventional process were examined respectively in terms of the switching charge variation to the polarization inversion frequency (polarization fatigue characteristic). FIG. 5 shows the result of this examination. In the figure, the y-axis represents the switching charge (residual polarization amount) [μc/cm$^2$], while the x-axis represents the switching cycle [log N frequency].

From the figure, it can be noticed that, in the case of the conventional PZT capacitor, the residual dielectric polarization starts to decline with $1\times10^5$ times of polarization inversion, while, in the case of the PZT capacitor according to the present invention, the decline of the residual dielectric polarization will not start, or the polarization fatigue will not occur, until the number of times of the polarization inversion reaches $1\times10^6$–$1\times10^7$.

One of the reasons for this is considered to result from that, in the amorphous PZT film crystallization process according to the present invention, Pb is deposited from the surface to the lower electrode interface, thereby changing the state of the absence of the Pb in the PZT film in the vicinity of the lower electrode interface.

Further, in the case of a sample, for which a process for forming an amorphous PZT film of 5 nm thick containing excessive Pb is inserted between the seed crystal film forming process and the film crystallization process, the residual dielectric polarization did not decrease until the number of times of the polarization inversion reaches $1\times10^7$. This is considered to results from the shortage of the Pb in the surface is supplemented.

Further, these samples were subjected to the forming gas annealing processing in a 3% hydrogen reducing atmosphere based on the nitrogen at 450° C. for 15 minutes. The result of this processing is shown in FIGS. 6A and 6B and FIGS. 7A and 7B. From these figures, it can be noticed that, in the case of the sample representing the conventional method, in which the crystallization starts from the lower electrode interface, the separation of the film in the Pt/PZT interface has occurred, while, in the case of the sample representing the method according to the present invention, in which the crystallization starts from the surface, the separation of the film has not occurred, proving the improvement in the bonding strength.

Further, the present inventor has prepared a sample differing in the ratio Zr to the sum of the Zr and Ti (Zr/(Zr+Ti) ratio) in the upper surface of the PZT crystal film 5 by using the method according to the present invention. As a result, it was found that, the film whose the Zr/(Zr+Ti) ratio is 0.3 or less has a better film characteristic, that is, the polarization fatigue characteristic than that of the conventional film. Hence, it is desirable for the Zr/(Zr+Ti) ratio in the upper surface of the PZT film to be 0.3 or less.

The Second Embodiment

FIGS. 8A-8D show the sectional views showing the processes for forming the PZT capacitor relating to the second embodiment of the present invention. For information, in these figures, the numerals and letters common to those given in FIGS. 1A-1E are omitted, and the detailed description thereof are also omitted.

The present embodiment differs from the first embodiment in that the amorphous PZT film 3 is formed on the Pt film 2 through the amorphous SRO film 7.

Figure 8A:
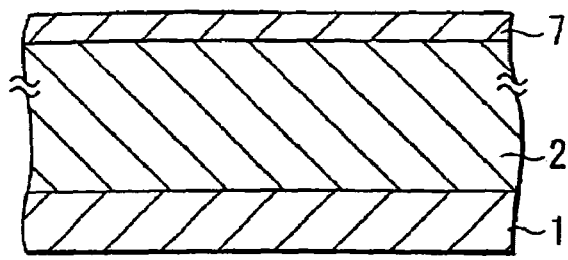
FIGS. 8A-8D are sectional views showing the forming processes of the PZT capacitor according to the present invention.

First, as shown in FIG. 8A, similarly to the case of the first embodiment, Ti film 1 and Pt film 2 are formed on the ground insulation film (not shown), and subsequently an amorphous SRO film 7, 10 nm thick, is formed on the Pt film 2 by the puttering method. The sputtering process is executed applying electric power of 200 W for 24 seconds for forming the film in Ar atmosphere having a reduced pressure.

Figure 8B:
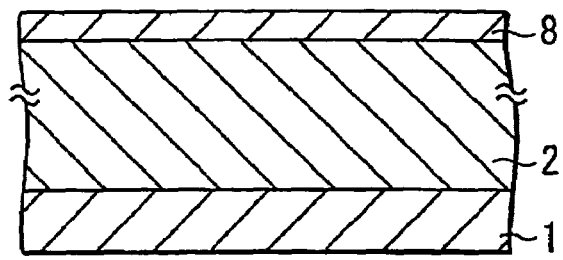

Next, as shown in FIG. 8B, the amorphous SRO film 7 is crystallized for forming a crystalline SRO film 8 by applying the annealing processing at 650° C. for 30 seconds in the oxygen atmosphere.

Figure 8C:
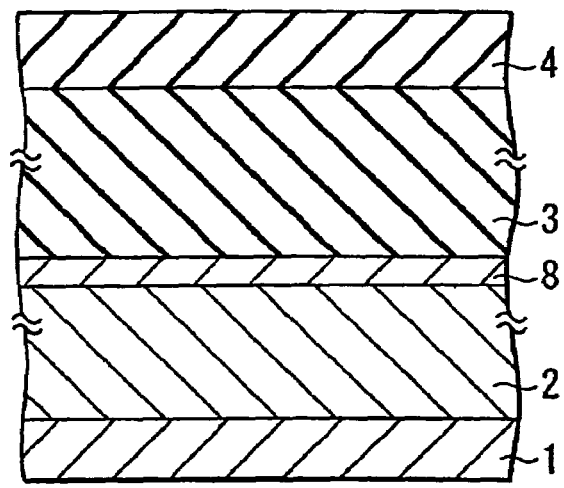
Figure 8D:
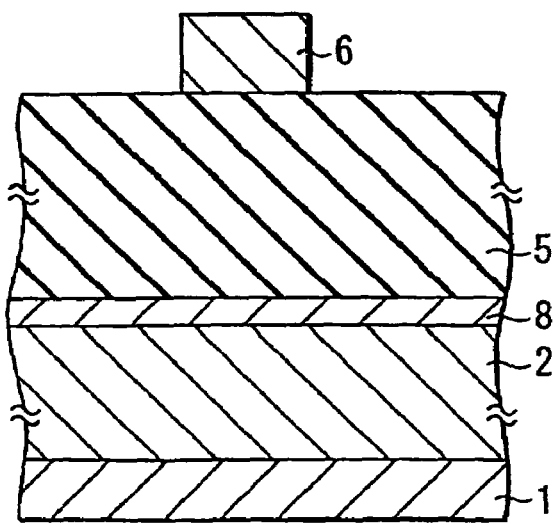

The processes following this process are similar to those in the case of the first embodiment. As shown in FIG. 8C, an amorphous PZT film 3 having thickness of 90 nm is formed in Ar atmosphere, and this process is followed by the formation of amorphous PZT film 4 having thickness of 18 nm in the Ar atmosphere with oxygen added, the formation of a PZT crystal film 5 by RTA as shown in FIG. 8D, the formation a columnar Pt film 6 having thickness of 175 nm and diameter of 160 μm on the PZT crystal film 5, and a heat treatment process at 650° C. for 1 hour in the oxygen atmosphere by using an electric furnace to complete a PZT capacitor.

The hysteresis characteristic and the leakage current characteristic of the PZT capacitor according to the present invention and those of a conventional PZT capacitor are examined respectively. FIGS. 9A and 9B and FIGS. 10A and 10B show the result of this examination respectively.

Figure 9A:
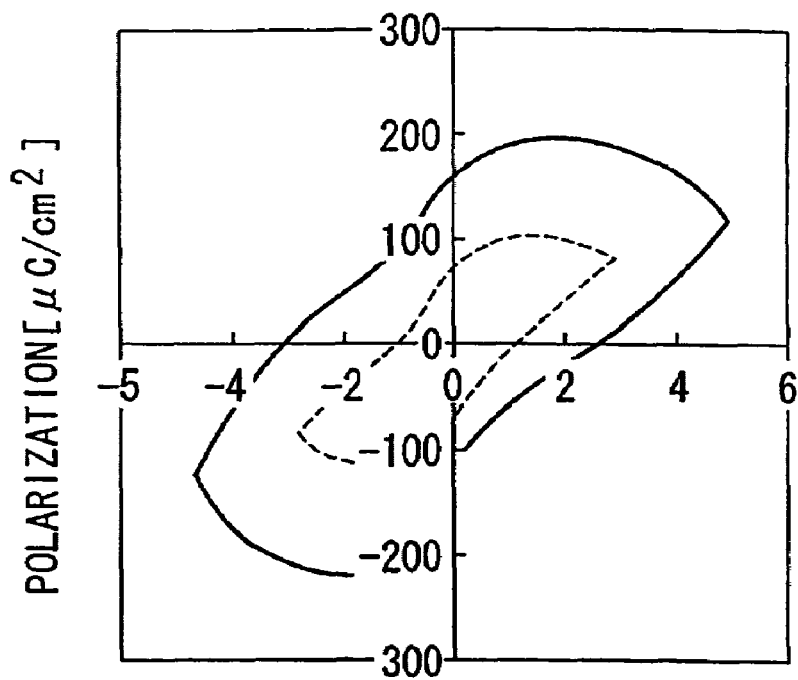
FIGS. 9A and 9B shows the P-V hysteresis characteristic and leakage current characteristic of the conventional PZT capacitor.
Figure 9B:
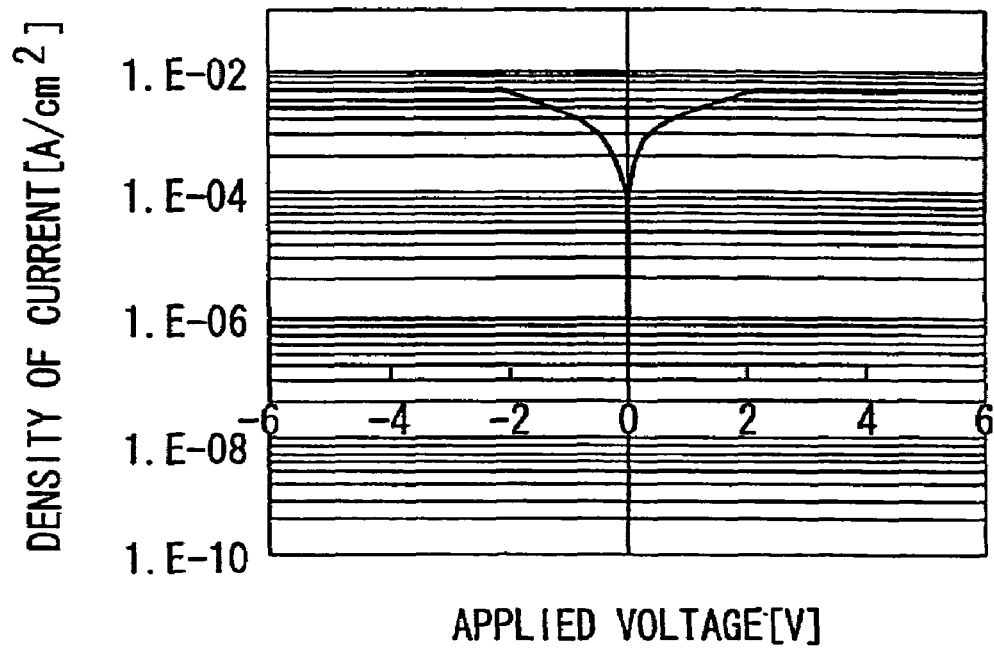

From FIGS. 9A and 9B, it can be noticed that, in the case of the conventional PZT capacitor, the high dielectric component of the hysteresis characteristic is hard to be recognized due to the effect of the leakage current component, and the leakage current density is exceeding the measurement limit to the applied voltage of ±3V or more or exceeding $1\times10^{-1}$A/cm$^2$.

Figure 10A:
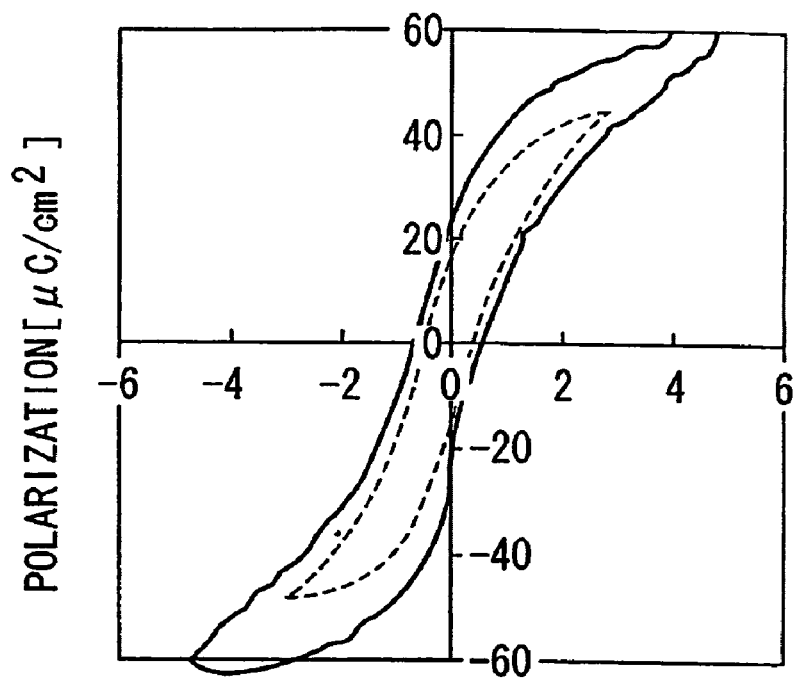
FIGS. 10A and 10B shows the P-V hysteresis characteristic and leakage current characteristic of the PZT capacitor according to the present invention.
Figure 10B:
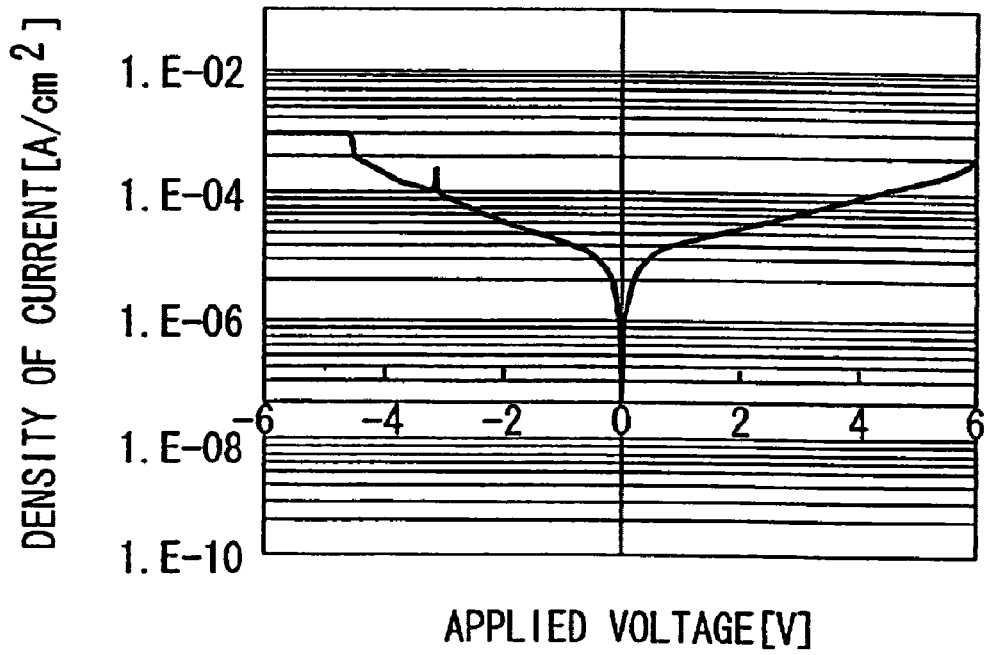

On the other hand, from FIGS. 10A and 10B, it can be noticed that, the PZT capacitor according to the present invention provides a hysteresis loop capable of saturating sufficiently even when driven at 3V where its thickness is 100 nm thick and 2Pr=40 μC/cm$^2$, and that the leakage current density is $10^{-4}$A/cm$^2$ or less where the applied voltage is ±3V. FIG. 25 shows the definition of 2Pr.

The results described above are considered to be attributable to the following. That is, the leakage current can be considered to be caused by that the constituents, especially Ru atom, of the SRO film is diffused into the PZT film to react with Pb, thereby forming a conductive oxide.

In the case of the conventional process wherein the crystallization progresses from the interface side of the lower electrode, the diffusion of Ru atom into the PZT film is facilitated to form the conductive oxide, the main cause of the leakage current. Therefore, it can be considered that the conventional process produces a large leakage current, while the process according to the present invention produces less leakage current.

Figure 11:
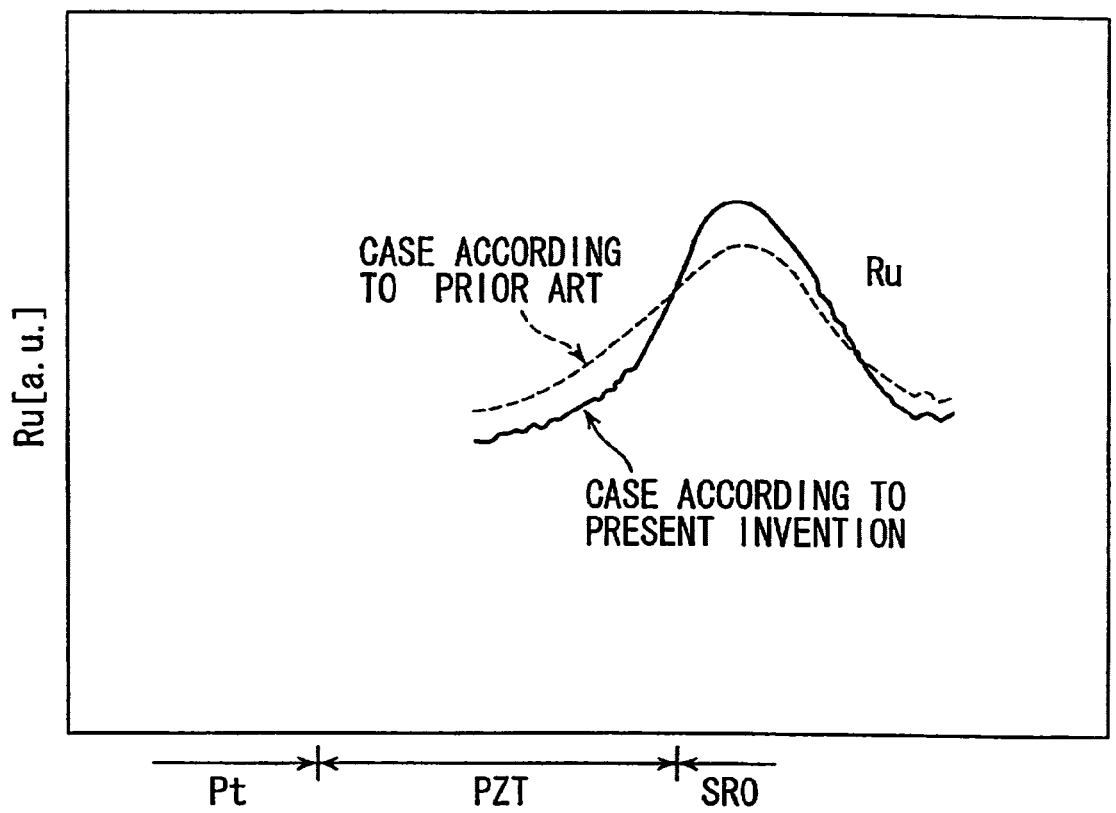
FIG. 11 shows the results of the SIMS (Secondary Ion Mass Spectroscopy) analysis of a crystallized conventional PZT film and a crystallized PZT film according to the present invention.

FIG. 11 shows the result of the SIMS analysis of the crystallized PZT film formed according to the process of the present invention and that of the PZT film formed according to conventional process. From the figure, it can be noticed that, compared with the PZT film according to the present invention, the conventional PZT crystal film shows a marked diffusion of Ru atom.

Further, the surface roughness can be considered as another cause of the leakage current. In the case of the conventional PZT film, it can be considered that there are many (triple) grain boundaries in upper and lower interface, thereby causing the effective length of the grain boundary, which can be the leak path, to be reduced, causing the increase in the leakage current. On the other hand, in the case of the present invention, it can be considered that, because of the smooth interface, the spread of the leakage paths is reduced, contributing to the reduction of the leakage current.

In order to improve the crystallizability of the SRO film, it is necessary to apply the heat treatment processing at high temperatures, but this process is not easy in terms of the thermal budget. Therefore, when the present invention is employed in using as a ground an electrode film such as the SRO film, which contains a factor that can cause the increase in the leakage current, the limitation by the ground film can be reduced, thereby expanding the margin of the capacitor film forming conditions compared with the conventional process. In addition, the alternatives in selecting the ground materials can be increased where the improvement of the surface roughness in the case of the first embodiment is taken into account.

The Third Embodiment

FIGS. 12A-12D are sectional views showing the processes for forming the PZT capacitor relating to the third embodiment of the present invention. For information, the numerals and letters common to the corresponding parts shown in FIGS. 1A-1E and the explanation thereof are omitted here.

This embodiment differs from the first embodiment in that an amorphous PZT film 3 is formed on the Pt film 2 through an IrO$_2$ film 9, and then the Pt electrode 6 is formed on the PZT crystal film 5 through the MgO crystalline film 10 (crystallization accelerating film) having contact hole.

Figure 12A:
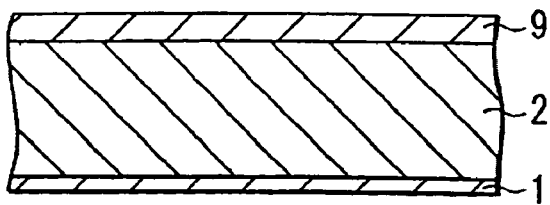
FIGS. 12A-12D are the sectional views of the forming process of the PZT capacitor according to the third embodiment of the present invention.

First, as shown in FIG. 12A, Ti film 1 and Pt film 2 are formed on a ground insulation film (not shown), and subsequently an IrO$_2$ film 9, 50 nm thick, is formed on the Pt film 2 by the sputtering method. The sputtering process is executed under the conditions where output power is 200 W, and flow rate is equivalent to Ar/O$_2$=20 sccm/20 sccm.

Figure 12B:
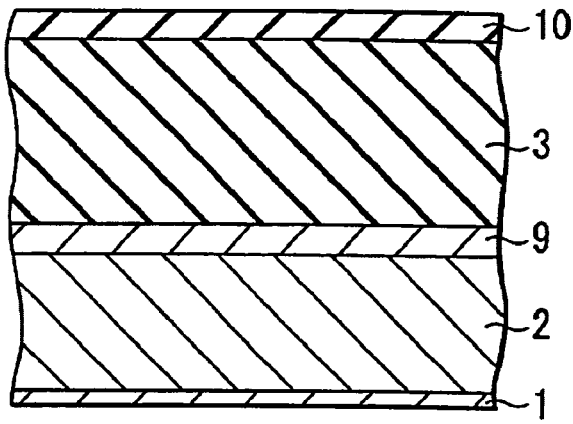

Next, as shown in FIG. 12B, an amorphous PZT film 3, 110 nm thick, is formed in Ar atmosphere, and subsequently a MgO crystalline film 10, 50 nm thick, is formed on the amorphous PZT film 3 by the puttering method. The film forming temperature of the MgO crystalline film 10 is 300° C. At this temperature, the crystallization of the amorphous PZT film 3 hardly progresses.

Figure 12C:
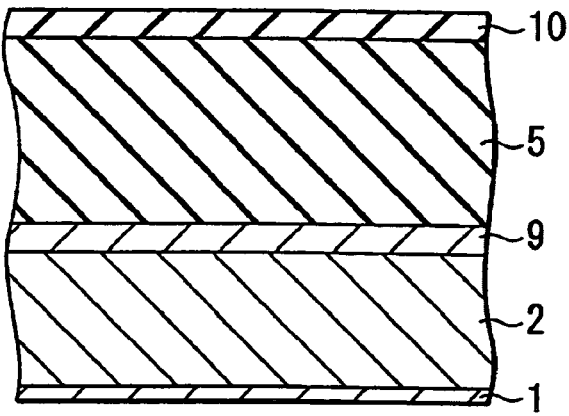

Next, as shown in FIG. 12C, the amorphous PZT film 3 is crystallized into single-crystal state by RTA to form PZT film 4.

Figure 12D:
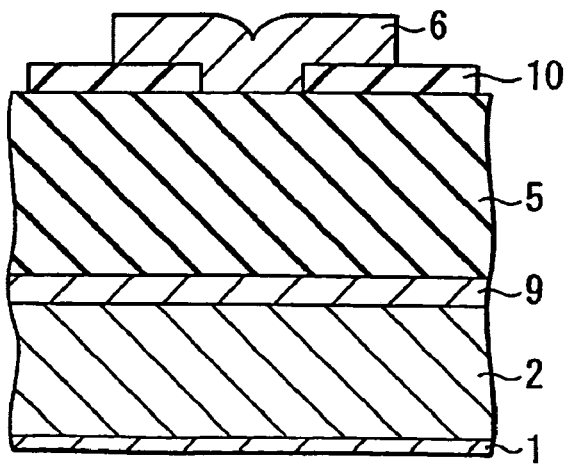

Next, as shown in FIG. 12D, an MgO film 10, having a contact hole with diameter of 160 μm, is formed on the PZT film 4, and subsequently a Pt electrode 6 is formed under the same conditions as those for the Pt film 2. The contact hole is formed by dry etching by using RIE.

Finally, the PZT capacitor is completed by processing at 650° C. for 1 hour in oxygen atmosphere by using an electric furnace.

The PZT capacitor formed by the above-described procedure and another PZT capacitor formed differing in the crystallization process of the amorphous PZT film were evaluated respectively. In the case of the conventional PZT capacitor, first, similarly to the case of the present embodiment, the amorphous PZT film (110 nm in thickness) is formed on the ground insulation film/Pt film/Ti film, and the amorphous PZT film is crystallized by RTA. Subsequent processes are similar to those of the present embodiment.

Figure 13A:
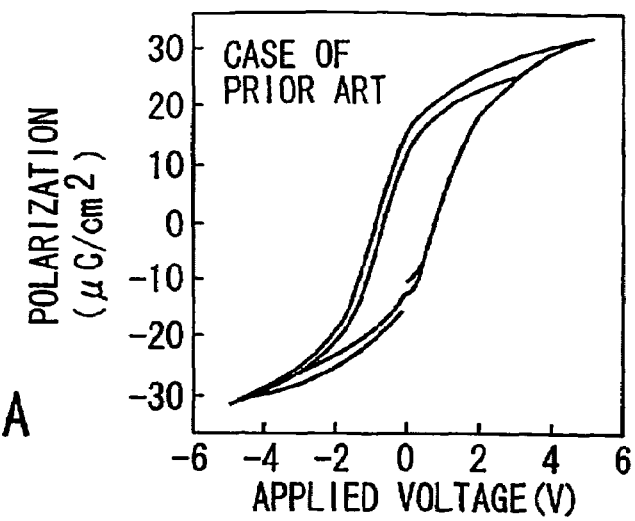
FIGS. 13A and 13B the result of evaluation of the hysteresis characteristic of the PZT capacitor according to the present invention and that of the PZT for comparison.
Figure 13B:
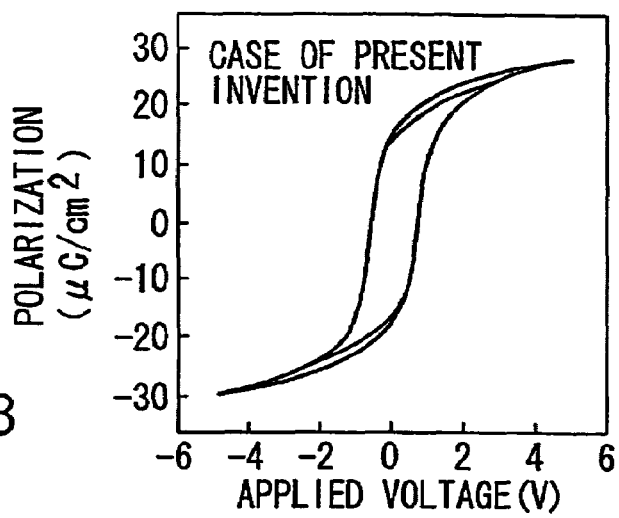

FIGS. 13A and 13B show the results of evaluation of the hysteresis of the PZT capacitor according to the present invention and that of the PZT capacitor to be compared respectively. It can be noticed that, in the case of the conventional PZT capacitor (FIG. 13A), in which the crystallization is started form the interface of the lower electrode, the rectangularity ratio of the hysteresis characteristic is not satisfactory, while in the case of the PZT capacitor according to the present invention (FIG. 13B), in which the crystallization is started from the upper MgO film, a satisfactory rectangularity ratio and 2Pr=40 μC/cm$^2$ can be obtained. Further, the definition of the rectangularity ratio is shown in FIG. 26. Further, in FIG. 26, those descriptions common to those in FIG. 25 are omitted.

Figure 14:
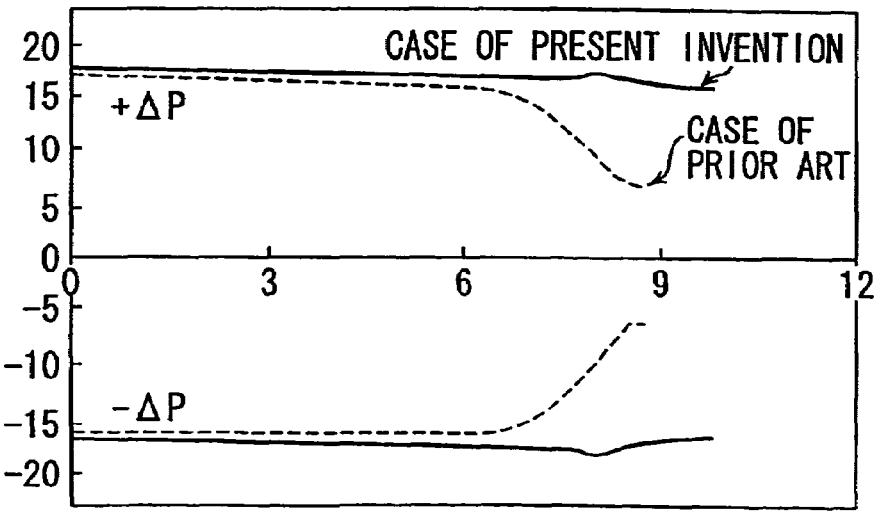
FIG. 14 shows the result of evaluation of the switching charge amount deterioration to the frequency of polarization reversal of the PZT capacitor according to the present invention and that of the PZT capacitor for comparison.

FIG. 14 shows the results of evaluation of the deterioration of the switching charge amount to the polarization inversion frequency for both the PZT capacitor according to the present invention and another PZT capacitor to be compared respectively. From the figure, it can be noticed that, in the case of the conventional PZT capacitor, the decrease in the residual polarization amount starts with the polarization inversion of 1×10$^7$ times, while in the case of the PZT capacitor according to the present invention, the residual polarization amount remains unchanged even with the polarization inversion of 1×10$^{10}$ times proving its freedom from the fatigue.

Further, the same result can be obtained even when Al$_2$O$_3$ film is used instead of the MgO film. In this case, even when (the PZT film) is subjected to the forming gas annealing processing at 200° C. for 15 minutes in a 3% hydrogen reducing atmosphere based on the nitrogen, the separation of the film can be prevented because of the decrease in the reducing effect on the PZT film owing to the protective effect produced by the Al$_2$O$_3$ film.

Further, the similar result can be obtained even when the MgO film is totally separated, and this is followed by the accumulation of the conductive film and the patterning of (the accumulated conductive film) for forming an upper electrode and the formation of a high dielectric capacitor structure.

Where a single-crystal MgO substrate is substituted for the MgO crystalline film 10, no problem will arise if the single-crystal MgO substrate is removed as such after it was subjected to heat treatment in an oxidizing atmosphere. With this method, the same advantage is obtained.

The Fourth Embodiment

FIGS. 15A-15E are sectional views showing the formation processes of the PZT capacitor relating to the fourth embodiment of the present invention.

Figure 15A:
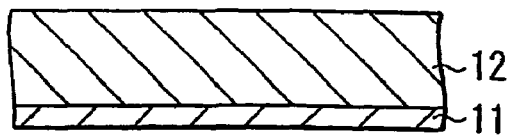
FIGS. 15A-15E are sectional views of the process for forming the PZT capacitor according to the fourth embodiment of the present invention.

First, as shown in FIG. 15A, a Ti film 11, 20 nm thick, and a Pt film 12, 175 nm thick, are formed sequentially as a lower electrode on the ground film. In this case, Ti oxide film may be used instead of the Ti film 11.

Figure 15B:
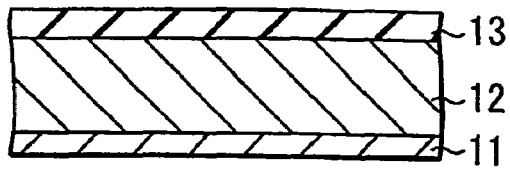

Next, as shown in FIG. 15B, an amorphous PZT film 13, 18 nm thick, is formed on Pt film 12 in the atmosphere of Ar—O$_2$ mixture gas. The amorphous PZT film 13, formed in the atmosphere of the Ar gas mixed with the oxygen, plays the role of the seed crystal film in the crystallization process. Further, according to the present invention, the surface of the amorphous PZT film 13 also means the area whose thickness ranges 1/10-1/20.

Figure 15C:
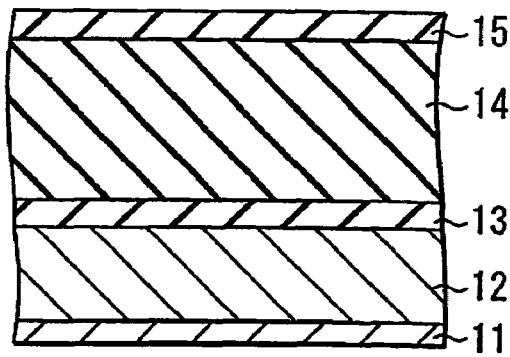

Next, as shown in FIG. 15C, amorphous PZT film 14, 80 nm thick, is formed on amorphous PZT film 13 in Ar atmosphere, and subsequently amorphous PZT film 15, 18 nm thick, is formed in the atmosphere of Ar—O$_2$ mixture gas. The amorphous PZT film 15, with oxygen added, also plays the role of the seed in the crystallization process.

In the process described above, Ti film 11 and the Pt film 12 are formed by the puttering method, while the amorphous PZT films 13-15 are formed by the RF magnetron sputtering method. PZT target is formed by baking a material having a composition of (Pb: 1.07, La: 0.03) (Zr: 0.3, Ti: 0.7)O$_3$.

Further, the Ti film 11 is formed under the condition where output power is 1 KW, and film forming time is 3 seconds, in Ar atmosphere with reduced pressure, while the Pt film 12 is formed under the condition where the output power is 3 kW, and film forming time is 38 seconds in Ar atmosphere with reduced pressure.

Further, the amorphous PZT films 13 and 15 (seed crystal films) are formed under the condition where output power is 1 kW; gas forming time is 250 seconds; gas flow ratio, $Ar/O_2$=105 sccm/35 sccm; $Ar$—$O_2$ mixed gas atmosphere pressure is reduced, while the amorphous PZT film 14 is formed under the condition where the output power is 1 kW; film forming time is 322 seconds; Ar gas atmosphere pressure is reduced by 3.5 Pa.

Figure 15D:
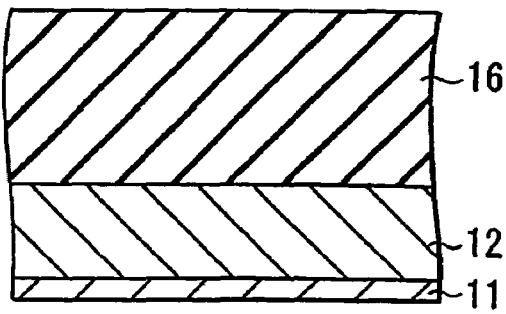

Next, as shown in FIG. 15D, the amorphous PZT films 13-15 are crystallized at 700° C. in the oxygen atmosphere by RTA to form a PZT film 16.

In this case, the crystallization of the amorphous films 13-15 are made to progress from the surface side of the amorphous PZT film 15 and the interface side of the amorphous PZT film 13 and Pt film 12, and the thickness of the amorphous film 16 becomes 100 nm because of the contraction of the film due to the removal of Pb and the like. The results of measurements endorsing this are given in FIGS. 16, 17, 18A-18E.

Figure 16:
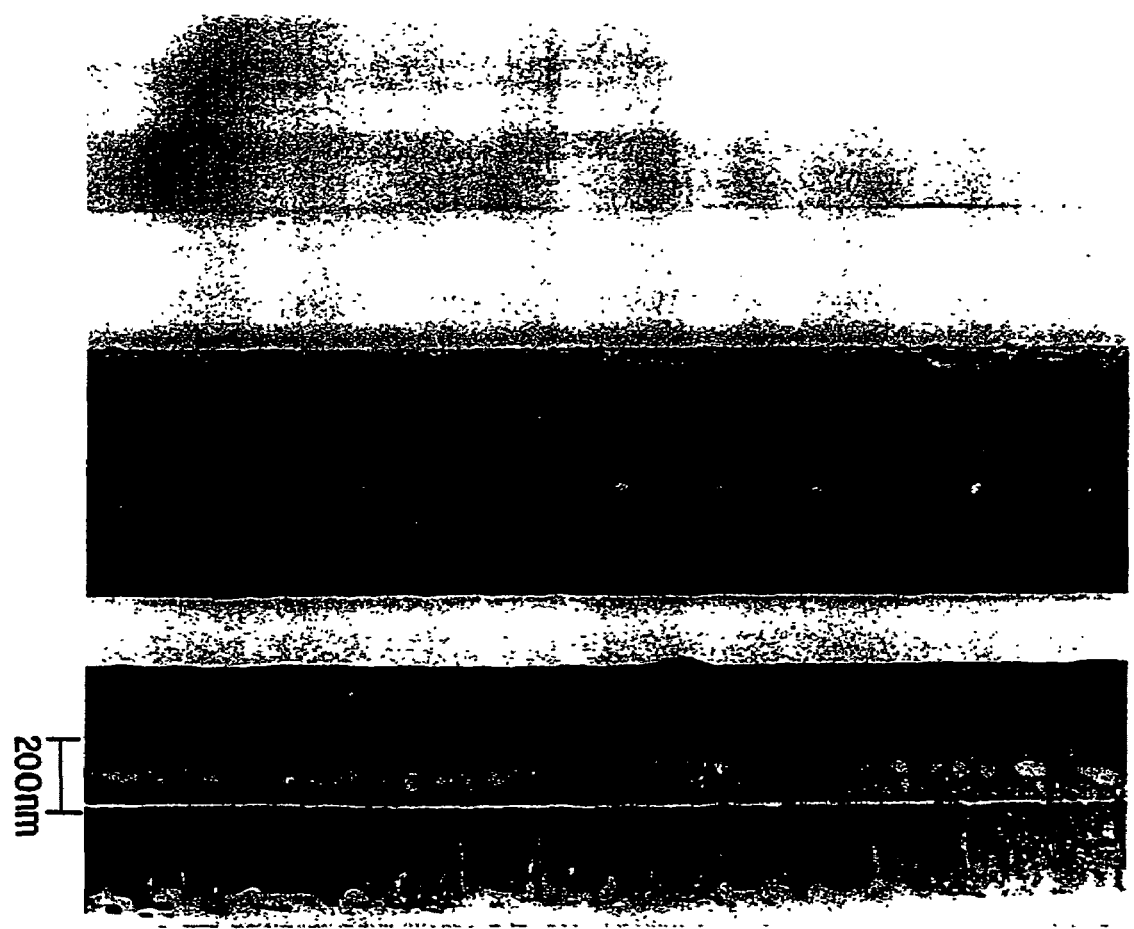
FIG. 16 is a photo sectional TEM (Transmission Electron Microscope) photo of the PZT film according to the present invention.
Figure 17:
FIG. 17 is an enlarged TEM photo of the essential part of FIG. 16.

FIG. 16 shows a TEM photo showing the sectional view of the PZT crystal film 16, obtained by crystallizing the previously described amorphous PZT films 13-14, and FIG. 17 its enlarged photo. From the figure, it can be noticed that the crystallization has progressed from the surface side. Further, the interface can be observed at the central portion (base interface portion) between the upper face (surface) and the lower face (back face) of the PZT film 16. This can be considered to have resulted from that the crystallization has progressed form upper side and lower side of the amorphous silicon film.

FIGS. 18A and 18B are SEM photos showing the PZT crystal film 16 (FIG. 18A) and the PZT film (FIG. 18B) according to the conventional process respectively, and, from the figures, it can be noticed that an extremely smooth surface morphology can be obtained by starting the crystallization from the surface.

The reason why such a fine surface morphology is obtained has not been clarified yet, but the present inventor presumes that this has something to do with the mechanism resulting from the stress. Further, it is also considered to be another contributing factor that the surface roughness, which is apt to occur when the share of Zr is larger than that of Ti, is suppressed by starting the crystallization from the upper surface, thereby preventing the Zr content from becoming excessive in the surface side by forming near-stoichiometry crystal.

Figure 15E:
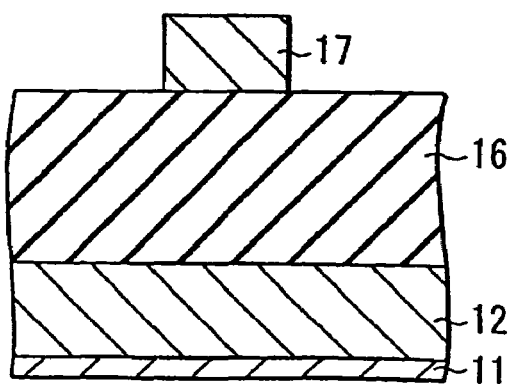

Next, as shown in FIG. 15E, a columnar Pt electrode 17, having thickness of 175 nm and diameter of 160 nm and as an upper electrode, is formed on the PZT crystal film 16. The Pt film, before being patterned into the Pt electrode 17, is formed by the sputtering method under the film forming conditions similar to those of the Pt film 12.

Finally, the PZT capacitor is completed by applying a heat treatment processing at 650° C. for 1 hour in an oxygen atmosphere by using an electric furnace.

For the PZT capacitor according to the present invention and the PZT capacitor according to the conventional process are examined respectively as to the deterioration of the switching charge amount (polarization fatigue characteristic) and hysteresis characteristic.

Figure 19:
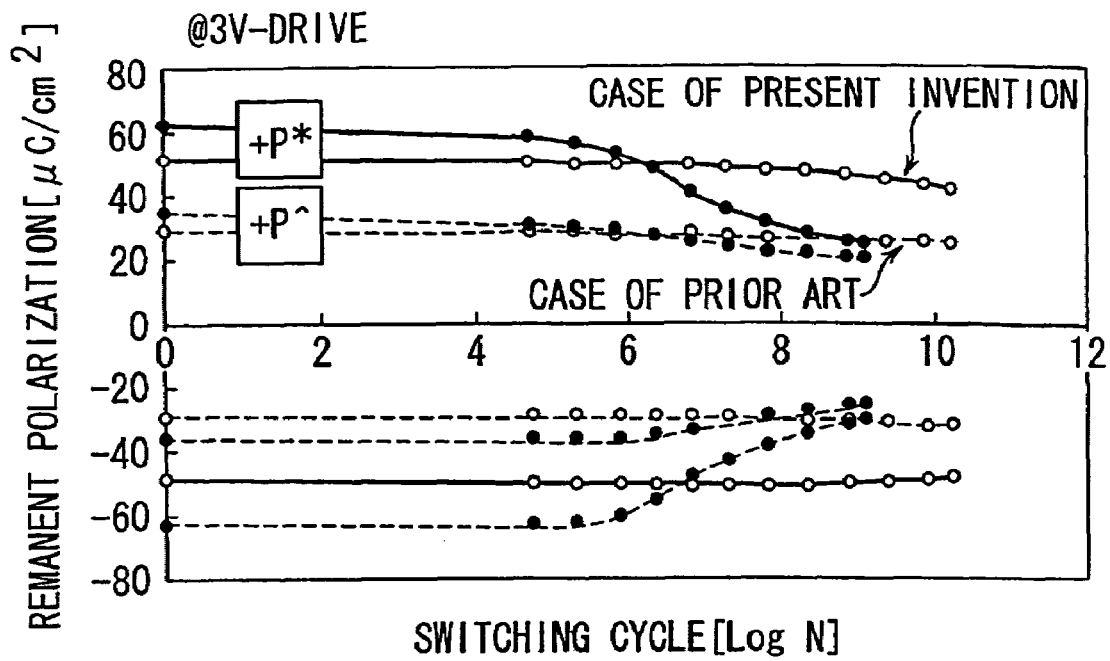
FIG. 19 is a diagram showing the polarization fatigue characteristic of the PZT film according to the present invention and that of the conventional PZT film respectively.
Figures 20A, 20B:
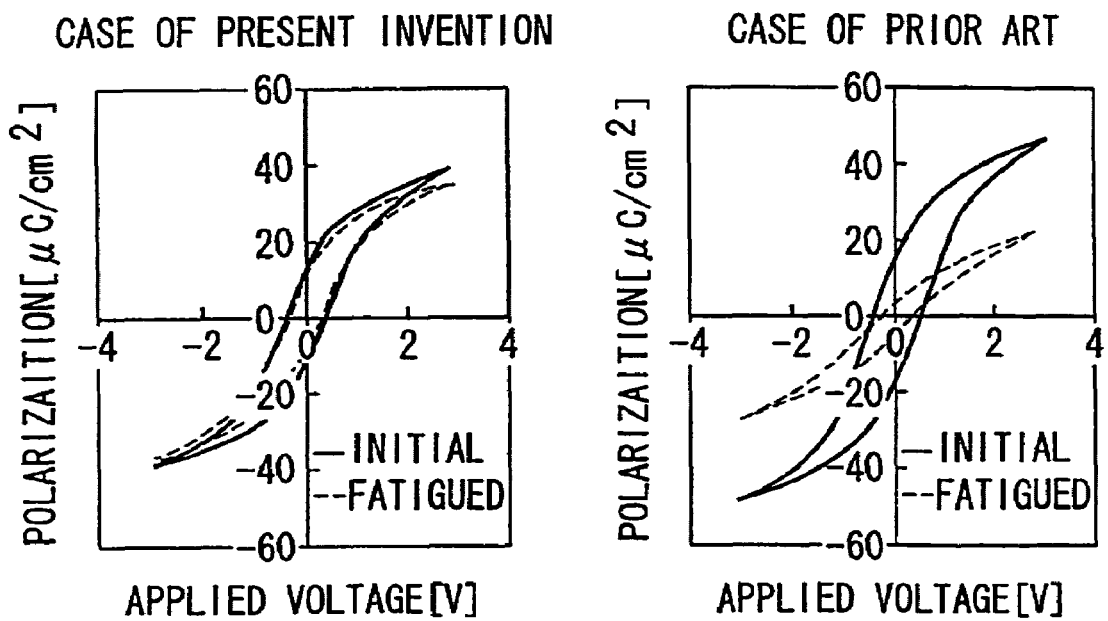
FIGS. 20A and 20B show the hysteresis characteristic of the PZT film according to the present invention and that of conventional PZT respectively.

FIG. 19 shows the result of the evaluation of the polarization fatigue characteristic, while FIG. 20 shows the result of evaluation of the hysteresis characteristic. From FIG. 19, it can be noticed that, in the case of the conventional capacitor, the decline of the residual polarization amount starts with the polarization inversion of $1\times10^5$ times, while, in the case of the PZT capacitor according to the present invention, the residual polarization remains unchanged even with the polarization inversion of $1\times10^{10}$ times, thereby indicating that it is free from the fatigue. Further, FIGS. 20A and 20B show that the conventional PZT capacitor presents a poor angularity ratio as a hysteresis characteristic, while, in the case of the PZT capacitor according to the present invention, a satisfactory angularity ratio can be obtained.

The above result can be considered to be attributable to that, where the Pb content in each of the amorphous PZT films 13 and 15 corresponding to the base interface is excessive by about 20% to the stoichiometry, the surplus Pb deposited from both sides reacts quickly with the Zr or Ti in the amorphous film 14 during the crystallization process of the amorphous PZT film 14, and the most of the Pb, which have not contributed to the reaction, evaporate outside through the grain boundary diffusion. Further, the Pb starts to volatilize conspicuously at around 350° C.

Further, the interface between the amorphous PZT film 13 and the amorphous PZT film 14 and that between the amorphous film 14 and the amorphous PZT film 15 are crystallized in the initial stage of the crystallization, so that the omission of Pb in the vicinity of the interface of the crystallized PZT film is unapt to occur during the heat treatment (heat treatment in oxygen atmosphere following the formation of the Pt film 17) in the manufacturing process.

In other words, it can be considered that the polarization fatigue characteristic and the hysteresis characteristic are improved owing to not only that the layer having a low dielectric constant is hard to be formed in horizontal direction of the film but also that the defect in the interface is small, and its distribution is symmetrical in the direction of the film thickness. Further, it was confirmed that, in the case of the PZT capacitor, in which a process for forming a 5 nm thick amorphous PZT film containing an excessive amount of Pb is provided between the process for forming the amorphous PZT film 15 and the process for crystallizing the amorphous PZT films 13-15, the residual polarization will not decrease even with $1\times10^{10}$ times. This is considered to result from the omission of the Pb in the surface is supplemented additionally.

Further, the forming gas annealing processing at 450° C. for 15 minutes in a 3% hydrogen reducing atmosphere, with the nitrogen contained as a main component, is applied to the conventional PZT capacitor and the PZT capacitor according to the present invention respectively.

The interface between the PZT film and Pt film before and after the forming gas annealing processing was examined respectively.

As a result, it was confirmed that, in the case of the conventional PZT capacitor, the film separation occurred in the interface between the Pt film and the PZT film, while, in the case of the PZT capacitor according to the present invention, the film separation did not occurred, proving the improvement in the bonding strength.

Further, the samples varying in the ratio of Ti to $Zr/(Zr+Ti)$ ratio) in the upper surface and the lower surface of the PZT crystal film (interface with Pt film) were prepared by using the method according to the present invention. As a result, it was found that the film characteristic, specifically the polarization fatigue characteristic, of the samples were better than that of the conventional PZT crystal film, where the $Zr/(Zr+Ti)$ ratio is 0.3 or less.

Therefore, the Zr/Ti ratio in the upper surface and lower surface of the PZT crystal film 16 is desirable to be 0.3 or less.

The Fifth Embodiment

FIGS. 21A-21D sectional views showing the forming processes of the PZT capacitor relating to the fifth embodiment of the present invention. Further, the common numerals and letters are assigned to those parts corresponding to those in FIGS. 15A-15E, so that the detailed descriptions thereof are omitted here.

The present embodiment differs from the fourth embodiment in that a Pt electrode 18 is formed on the PZT crystal film 16 through a MgO crystalline film 18 (crystallization accelerating film) having a contact hole.

Figure 21A:
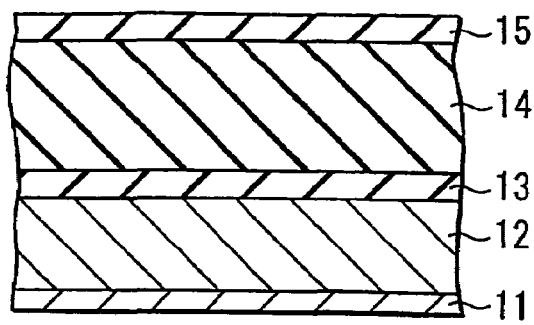
FIGS. 21A-21D are sectional views showing the forming process of the PZT capacitor according to the fifth embodiment of the present invention.
Figure 21B:
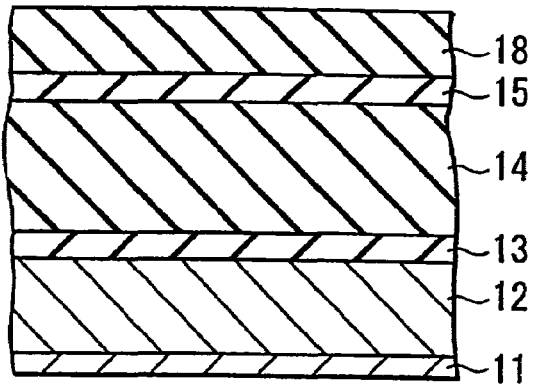

First, as shown in FIG. 21A, similarly to the case of the fourth embodiment, Ti film 11 and Pt film 12 are formed on a ground insulation film (not shown), and subsequently an amorphous PZT film 13 and amorphous PZT film 14, 18 nm thick respectively, are formed in the atmosphere of Ar—$O_2$ mixed gas, which is followed by the formation of a 90 nm thick amorphous PZT film 15 in the Ar atmosphere. The time required for the film formation is 462 seconds.

Figure 21C:
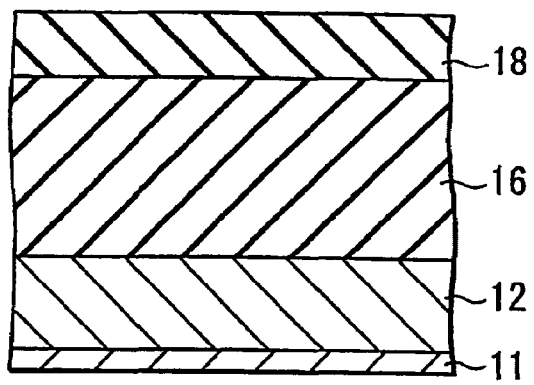

Next, as shown in FIG. 21C, a MgO crystalline film 18, 50 nm thick, is formed on the amorphous PZT film 15 by the sputtering method. The film forming temperature (substrate temperature) of the MgO crystalline film 18 is 300° C. At this temperature, the crystallization of the amorphous PZT films 13-15 hardly progresses.

Next, as shown in FIG. 21C, the amorphous PZT films 13-15 are converted into single-crystal films to form a PZT crystal film 16.

Figure 21D:
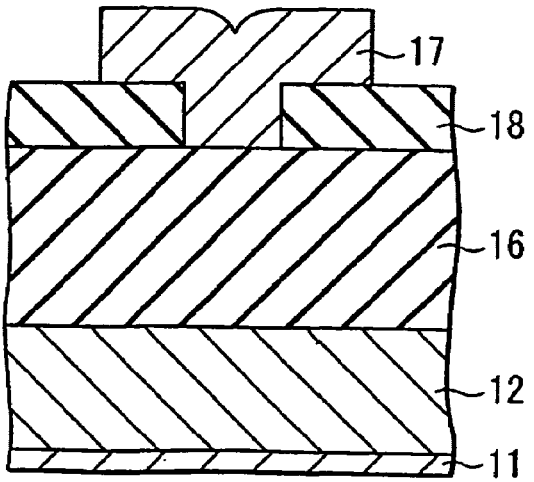

Next, as shown in FIG. 21D, a MgO film 10, having a contact hole with an aperture of 160 μm, is formed on the PZT crystal film 16, and subsequently a Pt electrode 17 is formed under the same conditions as those for the Pt film 12. The contact hole is formed by dry etching by using RIE.

Finally, PZT capacitor is completed by applying heat treatment at 650° C. for 1 hour in the oxygen atmosphere.

The PZT capacitor according to the present invention formed by the process described above and the PZT capacitor according to the conventional process differing in the crystallization process of the amorphous PZT film from the process of the present invention were evaluated respectively. In the case of the conventional PZT capacitor, first, similarly to the case of the present embodiment, an amorphous PZT film (film thickness: 18 nm) and an amorphous PZT film (film thickness: 90 nm), which are to become the seed crystal films, are formed on the ground insulation film/Pt film/Ti film, and the amorphous PZT films are crystallized. The processes following this process are the same as those of the present embodiment.

For the PZT capacitor obtained according to the process of the present invention and the PZT capacitor obtained according to the conventional process, the deterioration of the switching charge amount to the polarization inversion frequency (polarization fatigue characteristic) and hysteresis characteristic were examined.

Figure 22A:
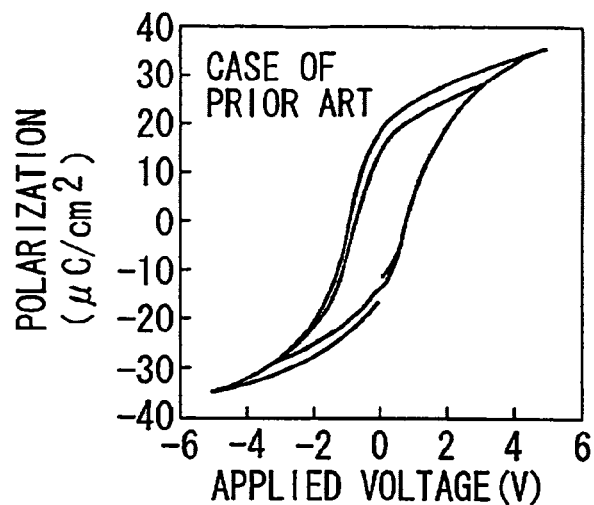
FIGS. 22A and 22B shows the hysteresis characteristic of the PZT film according to the present invention and that of the conventional PZT.
Figure 22B:
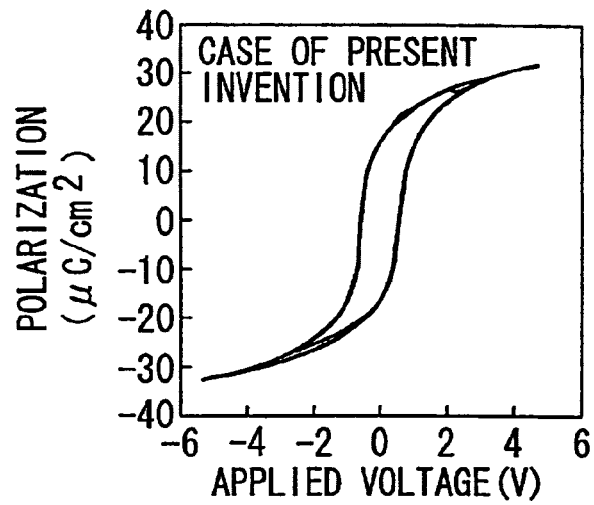

FIGS. 22A and 22B show the result of the hysteresis characteristic evaluation and the result of the polarization fatigue characteristic respectively. From FIG. 22, it can be noticed that the conventional PZT capacitor shows a poor rectangularity ratio of the hysteresis characteristic, while the PZT capacitor according to the present invention shows a satisfactory rectangularity ratio (2Pr=35 μC/cm$^2$).

Figure 23:
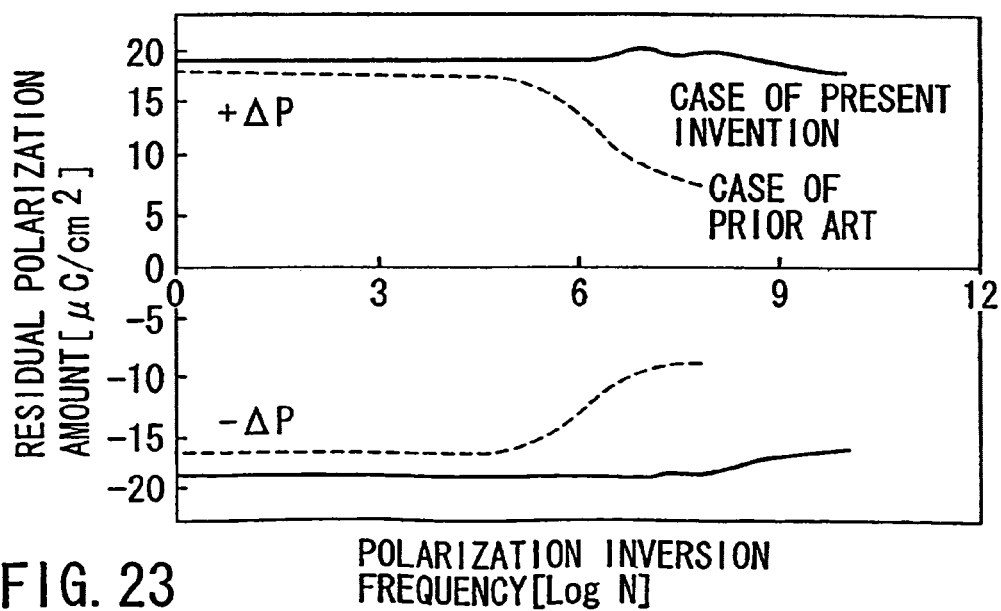
FIG. 23 shows the polarization fatigue characteristic of PZT film according to the present invention and that of conventional PZT film.

Further, FIG. 23 shows that, in the case of the conventional PZT capacitor, the decline of the residual polarization amount starts with the polarization inversion of $1\times10^5$ times, while, in the case of the PZT capacitor according to the present invention, the residual polarization remains unchanged even with the polarization inversion of $1\times10^9$ times, thereby proving its freedom from the fatigue.

Further, the same result can be obtained even when $Al_2O_3$ film is used instead of the MgO film. In this case, even when the forming gas annealing processing is applied at 200° C. for 15 minutes in 3% hydrogen reducing atmosphere based on the nitrogen, the reducing effect on the PZT film is decreased owing to the protection by the $Al_2O_3$ film 18 to effectively prevent occurrence of film separation. Further, similar effect can be obtained where Pt electrode 17 is formed after completely removing the MgO film 18.

In the above-described embodiment, the MgO crystalline film 18 formed by the sputtering method using is used as a seed, and the amorphous PZT film 15, etc. is crystallized, whereby the PZT crystalline film 16 is formed. Alternatively, the PZT crystalline film may be formed by the following method. The single-crystal MgO substrate is closely attached on the amorphous PZT film 15, and an RTA process is carried out. Thereby, the amorphous PZT film 15, etc. is made into a single-crystal film, thus producing the PZT crystalline film 16. With this method, too, the ferroelectric properties and the reliability are enhanced.

If an MgO film is formed on the amorphous PZT film by sputtering and an MgO single-crystal substrate is closely attached to the MgO film, more excellent ferroelectric properties and reliability are obtained.

Further, the present invention is not limited to this embodiment. For instance, the above description of the embodiment is concerned with a single unit of the capacitor, but the capacitor according to the embodiment may comprise a MOS transistor for drive, having the CMOS structure for Ferroelectric RAM, formed on a silicon substrate, interlayer insulation film for covering the MOS transistor and a ground insulation film formed thereon. By doing so, the imprint retention can be improved.

Further, in this embodiment, the amorphous PZT film is used as a seed crystal film, but the same effect can be obtained even when the B-site atom or its compound such as Ti or $PbTiO_3$ is used.

That is, for example, when Ti is formed in the surface (upper surface) or in both the surface (upper surface) and back (lower surface) of the amorphous PZT film, the temperature at which the crystallization starts becomes lower, so that the crystallization can be started from the upper surface side.

Further, in forming the amorphous PZT film, especially when forming its upper surface portion, Ar gas pressure may be reduced. By doing so, the content of Pb, as an A-site atom, becomes lower in the portion close to the surface than in the interface of the lower electrode, so that the crystallization from the surface side can be made easier. Or a multi-layer amorphous PZT film, whose Pb content is lower in the vicinity of the surface than that in the interface of the lower electrode, may be formed.

Further, the present invention is not limited to the PZT film but is effective for those insulation films, each made of the $ABO_3$ perovskite type oxide dielectric (A: a substance including one or more elements selected from among Pb, Ba and Sr; B: a substance including one or more elements selected from among Zr, Ti, Ta, Nb, Mg, W, Fe and Co).

Further, for the crystallization accelerating film, the single-layer film of a substance or the multi-layer film of the substances selected from among those of $Al_2O_3$ film, sapphire film, $Y_3Fe_5O_{12}$ film, $(YGd)_3FeO_{12}$ film, Ag film or Pt film (including MgO film) may be used besides the MgO film.

For the crystallization inhibiting film, the single-layer film or multi-layer film (including the oxidized Ir film), each comprising a single film or combinations of the films selected from among Au film, oxidized Au film, Ir film, Ru film, oxidized Ru film, Rh film and oxidized Rh film, may be used besides the $IrO_2$ film.

Further, the present invention is not limited to the application to the high dielectric film but also is applicable to another high dielectric film such as BST film and is capable of suppressing the increase in the leakage current.

Furthermore, the processes described in the foregoing may be combined properly. Besides, the present invention may be applied in various forms within the concept of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method, comprising a process for forming a crystalline insulation film made of an $ABO_3$ perovskite type oxide dielectric on a ground film, a process for forming an amorphous film, which is to be the crystalline insulation film, on the ground film and a process for forming the crystalline insulation film by crystallizing the amorphous film at least from the upper surface side thereof,
   wherein the composing ratio of the B-site atom of the amorphous film is set selectively so that the temperature, at which the crystallization of the amorphous film starts, is set to decrease gradually from the central portion of the amorphous film towards the upper surface side and an interface between the amorphous film and the ground film.

2. The semiconductor device manufacturing method according to claim 1, wherein, of the $ABO_3$ perovskite type oxide dielectrics, the A is a substance including at least one element selected from among Pb, Ba and Sr, while the B is a substance including at least one element selected form among Zr, Ti, Ta, Nb, Mg, W, Fe and Co.

3. The semiconductor device manufacturing method according to claim 1, comprising one of a process for introducing the oxygen at least onto the upper surface of the amorphous film prior to the crystallization thereof and a process for forming an amorphous film, having a smaller thickness and a higher oxygen content than those of the amorphous film, at least on the upper surface of the amorphous film.

4. The semiconductor device manufacturing method according to claim 1, further comprising a process for introducing a material, whose temperature at which the crystallization starts is lower than that of the material constituting the amorphous film, at least onto the upper surface of the amorphous film prior to the crystallization of the amorphous film.

5. The semiconductor device manufacturing method according to claim 1, wherein the composition ratio of the A-site atom of the amorphous film is set in one of two manners, in one of which the ratio is lower at an interface between the amorphous film and the ground film than at the upper surface and in the other of which the ratio is lower at the upper and lower surfaces than at the interface.

6. The semiconductor device manufacturing method according to claim 1, further comprising a process for forming a crystallization accelerating film, having a higher crystalline orientation than that of the ground film, on the amorphous film prior to the crystallization of the amorphous film.

7. The semiconductor device manufacturing method according to claim 6, further comprising a process for removing the crystallization accelerating film after crystallization of the amorphous film.

8. The semiconductor device manufacturing method according to claim 6, wherein the crystallization accelerating film is one of a single-layer film and a laminate film made of at least one film selected from among the group of MgO film, $Al_2O_3$ film, Sapphire film, $Y_3Fe_5O_{12}$ film, $(YGd)_3FeO_{12}$, Ag film and Pt film.

9. The semiconductor device manufacturing method according to claim 6, wherein the constituting material of the crystallization accelerating film is an insulation material; an opening is formed in the crystallization accelerating film after crystallization of the amorphous film; further a process for forming an electrode to be connected with the crystalline insulation film through the opening is provided.

10. The semiconductor device manufacturing method according to claim 1, wherein the crystallization of the amorphous film from the side of the ground film is inhibited in the process for forming the crystalline insulation film.

11. The semiconductor device manufacturing method according to claim 1, wherein a crystallization inhibiting film, whose temperature at which the crystallization starts is higher than that of the amorphous film, is formed on the ground film, and, by forming the amorphous film on the crystallization inhibiting film, the crystallization of the amorphous film from the side of the interface with the ground film is inhibited in the process for forming the crystalline insulation film.

12. The semiconductor device manufacturing method according to claim 11, wherein the crystallization inhibiting film has a crystalline orientation characteristic lower than that of the ground film.

13. The semiconductor device manufacturing method according to claim 11, wherein the crystallization inhibiting film is one of a single-layer film and a laminate film made of at lest one film selected from among a group of Au film, oxidized Au film, Ir film, oxidized Ir film, Ru film and oxidized Ru film.

14. A semiconductor device manufacturing method comprising:
   forming a first amorphous insulation film made of an $ABO_3$ perovskite type oxide dielectric;
   forming a second amorphous insulation film made of an $ABO_3$ perovskite type oxide dielectric on the first amorphous insulation film, the second amorphous insulation film having higher oxygen content than that of the first amorphous film;
   forming a crystalline insulation film by crystallizing both of the first and second amorphous insulation films at a time.

* * * * *